United States Patent
Yang et al.

(10) Patent No.: US 12,014,954 B2
(45) Date of Patent: Jun. 18, 2024

(54) METHOD AND EQUIPMENT FOR FORMING GAPS IN A MATERIAL LAYER

(71) Applicant: TAIWAN SEMICONDUCTOR MANUFACTURING CO., LTD., Hsinchu (TW)

(72) Inventors: Chan-Syun David Yang, Hsinchu (TW); Li-Te Lin, Hsinchu (TW); Yu-Ming Lin, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/666,368

(22) Filed: Feb. 7, 2022

(65) Prior Publication Data

US 2022/0157648 A1     May 19, 2022

Related U.S. Application Data

(62) Division of application No. 15/843,185, filed on Dec. 15, 2017, now Pat. No. 11,244,856.

(60) Provisional application No. 62/564,906, filed on Sep. 28, 2017.

(51) Int. Cl.
| | |
|---|---|
| *H01L 21/3205* | (2006.01) |
| *H01L 21/311* | (2006.01) |
| *H01L 21/67* | (2006.01) |
| *H01L 21/768* | (2006.01) |
| *H01L 21/683* | (2006.01) |

(52) U.S. Cl.
CPC .... *H01L 21/7682* (2013.01); *H01L 21/31111* (2013.01); *H01L 21/31116* (2013.01); *H01L 21/31144* (2013.01); *H01L 21/67069* (2013.01); *H01L 21/76816* (2013.01); *H01L 21/6831* (2013.01)

(58) Field of Classification Search
CPC ........................ H01L 21/3205; H01L 21/31116
See application file for complete search history.

(56) References Cited

U.S. PATENT DOCUMENTS

| | | | | |
|---|---|---|---|---|
| 2015/0042973 A1* | 2/2015 | Mack | .................. | G03F 7/70383 |
| | | | | 355/71 |
| 2016/0064239 A1* | 3/2016 | Shih | .................... | H01L 21/0273 |
| | | | | 438/694 |
| 2018/0061653 A1* | 3/2018 | Sherpa | ................ | C23C 16/0245 |

(Continued)

*Primary Examiner* — Thomas T Pham
(74) *Attorney, Agent, or Firm* — Maschoff Brennan

(57) ABSTRACT

An equipment includes a supporter and an etching device. The supporter is configured to support a semiconductor device. The semiconductor device includes an etch stop layer, a material layer, and a mask layer. The mask layer has openings to expose portions of the material layer. The etching device is configured to emit a plurality of directional charged particle beams to etch the exposed portions of the material layer for forming gaps in the material layer, in which the etching device has plural ion extraction apertures to emit the directional charged particle beams. A vertical distance between the semiconductor device and the ion extraction apertures is determined in accordance with a profile of each of the gap, each of the directional charged particle beams has two energy peaks at two angles, and the angles are determined in accordance with a profile of each of the gaps and the vertical distance.

20 Claims, 33 Drawing Sheets

(56) References Cited

U.S. PATENT DOCUMENTS

2018/0123029 A1\* 5/2018 Park ................ H10N 50/10
2018/0233404 A1\* 8/2018 Shu ................ H01L 21/76816

\* cited by examiner

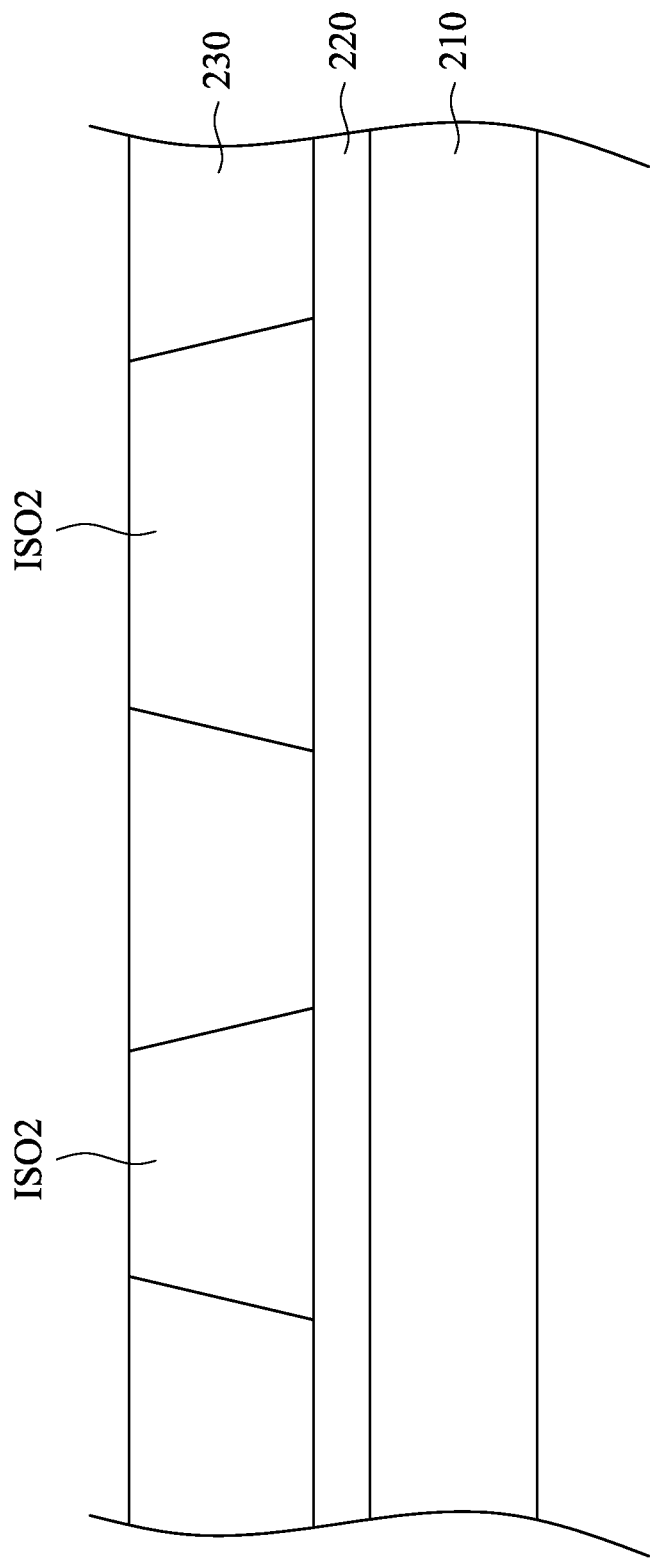

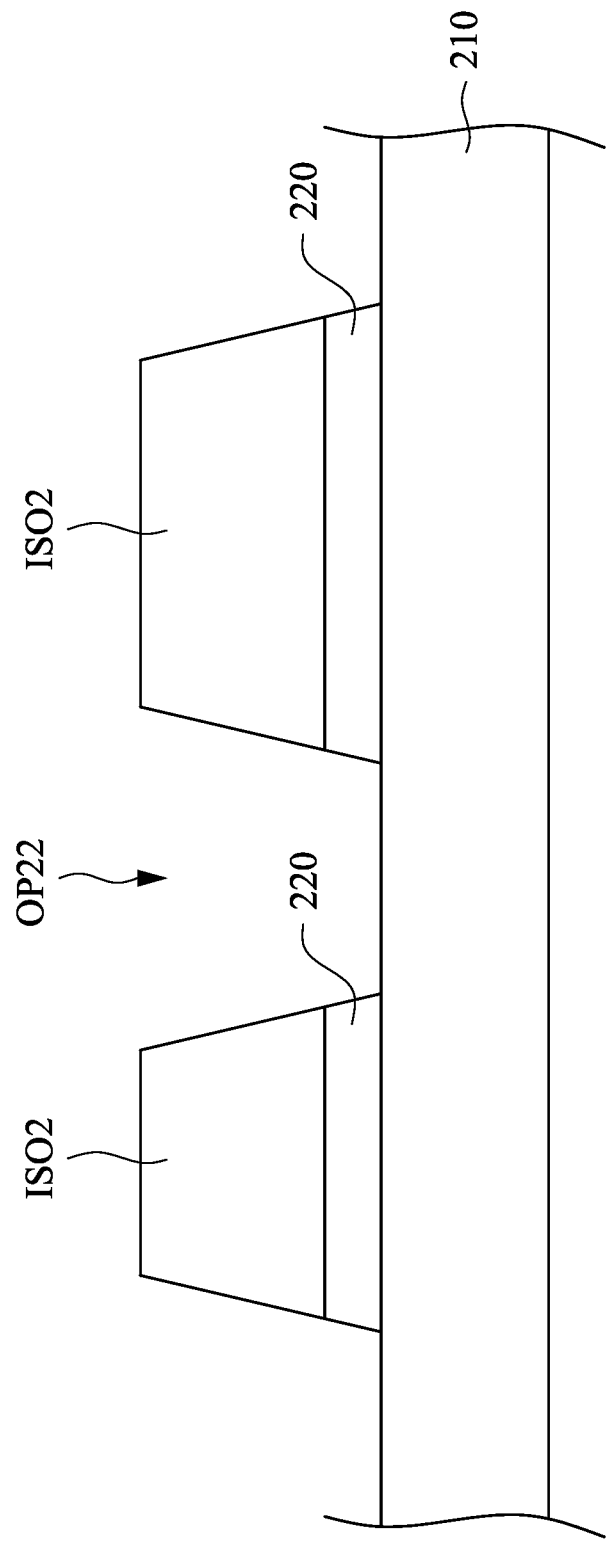

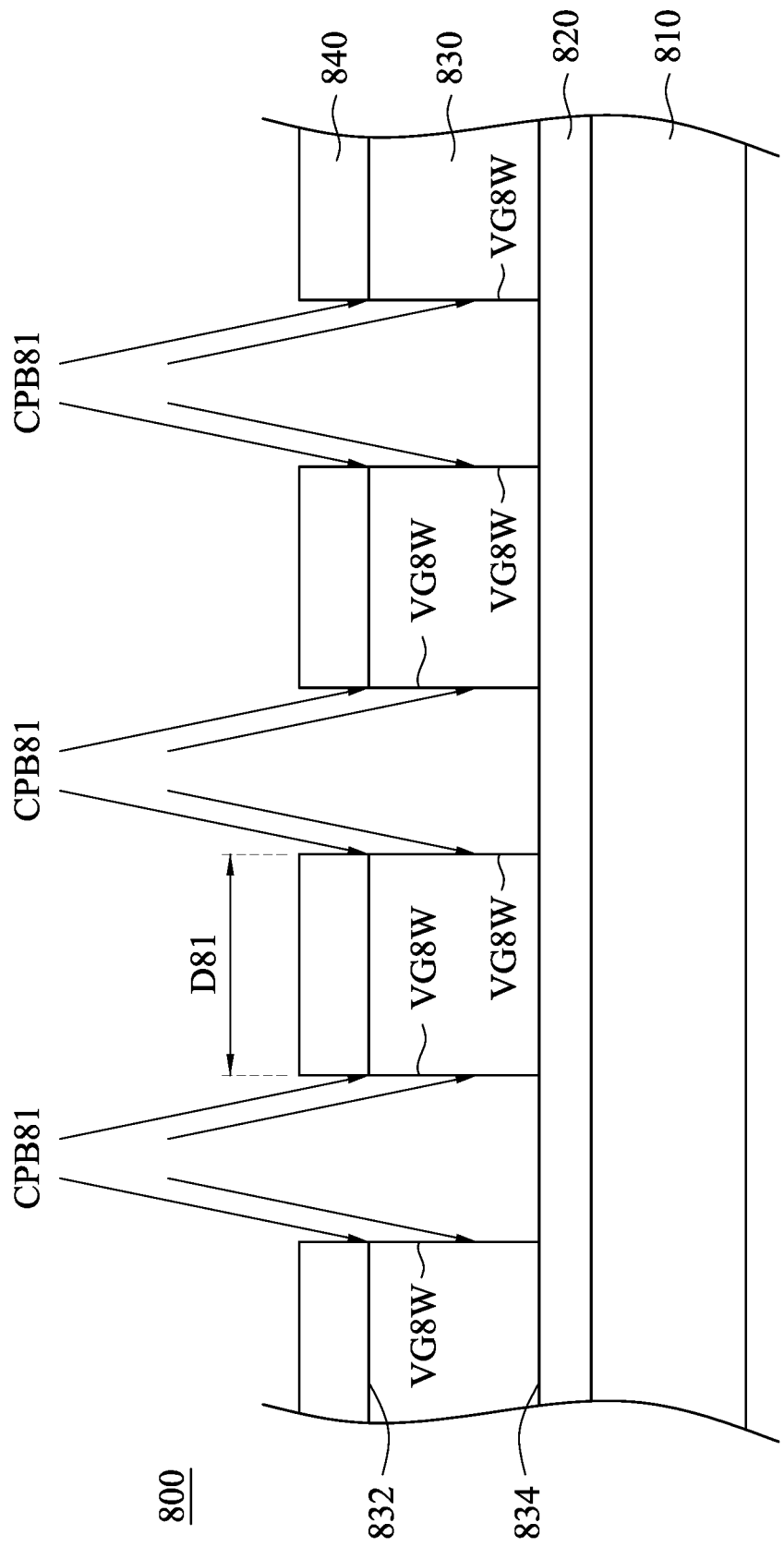
Fig. 8C(1)

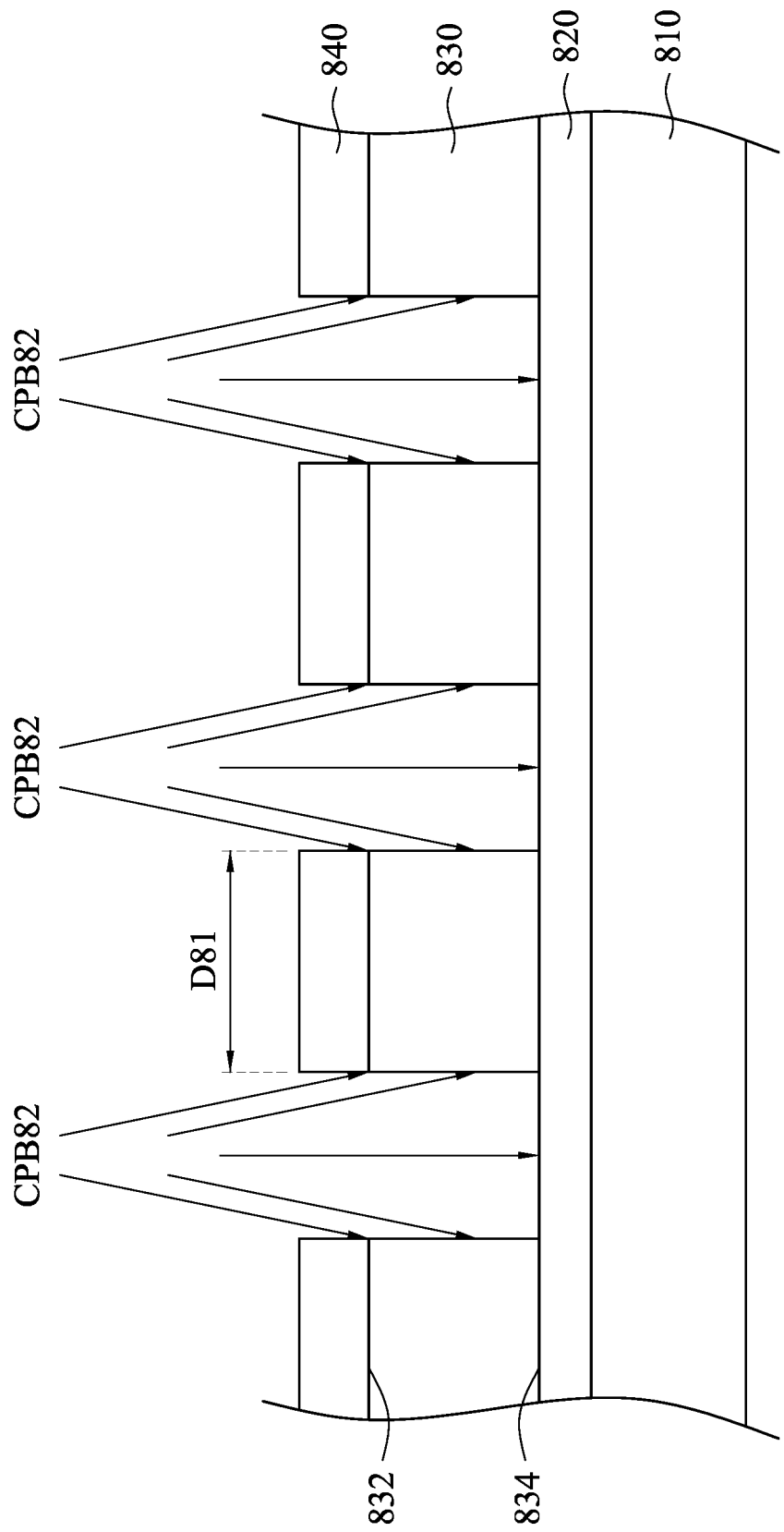
Fig. 8C(2)

METHOD AND EQUIPMENT FOR FORMING GAPS IN A MATERIAL LAYER

RELATED APPLICATION

The present application is a Divisional application of U.S. application Ser. No. 15/843,185, filed on Dec. 15, 2017, now U.S. Pat. No. 11,244,856, issued on Feb. 8, 2022, which claims priority of U.S. Provisional Application Ser. No. 62/564,906, filed on Sep. 28, 2017, which are herein incorporated by reference in their entireties.

BACKGROUND

The semiconductor integrated circuit (IC) industry has experienced rapid growth. In the course of the IC evolution, functional density (defined as the number of interconnected devices per chip area) has generally increased while geometry size (i.e., the smallest component (or line) that can be created using a fabrication process) has decreased. A scaling down process generally provides benefits by increasing production efficiency and lowering associated costs. But, such scaling down has increased the complexity of processing and manufacturing ICs. For these advances to be realized, similar developments in IC manufacturing are needed.

For example, multi-layer interconnects are important in IC manufacturing. Interconnects electrically connect together different conductive wiring layers in a semiconductor chip. The conductive layers can be layers formed on a substrate surface, such as source/drain contacts or gate structures. Typically, etching technologies are used to form gaps for the multi-layer interconnects. However, as the scaling down process continues, conventional methods for forming gaps for the multi-layer interconnects have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2F to FIG. 2H are cross-sectional views showing filling of metal material in accordance with an embodiment of the present disclosure.

FIG. 8A to FIG. 8D are cross-sectional views of intermediate stages showing a method for forming gaps in accordance with an embodiment of the present disclosure.

DETAILED DESCRIPTION

Figure 1:
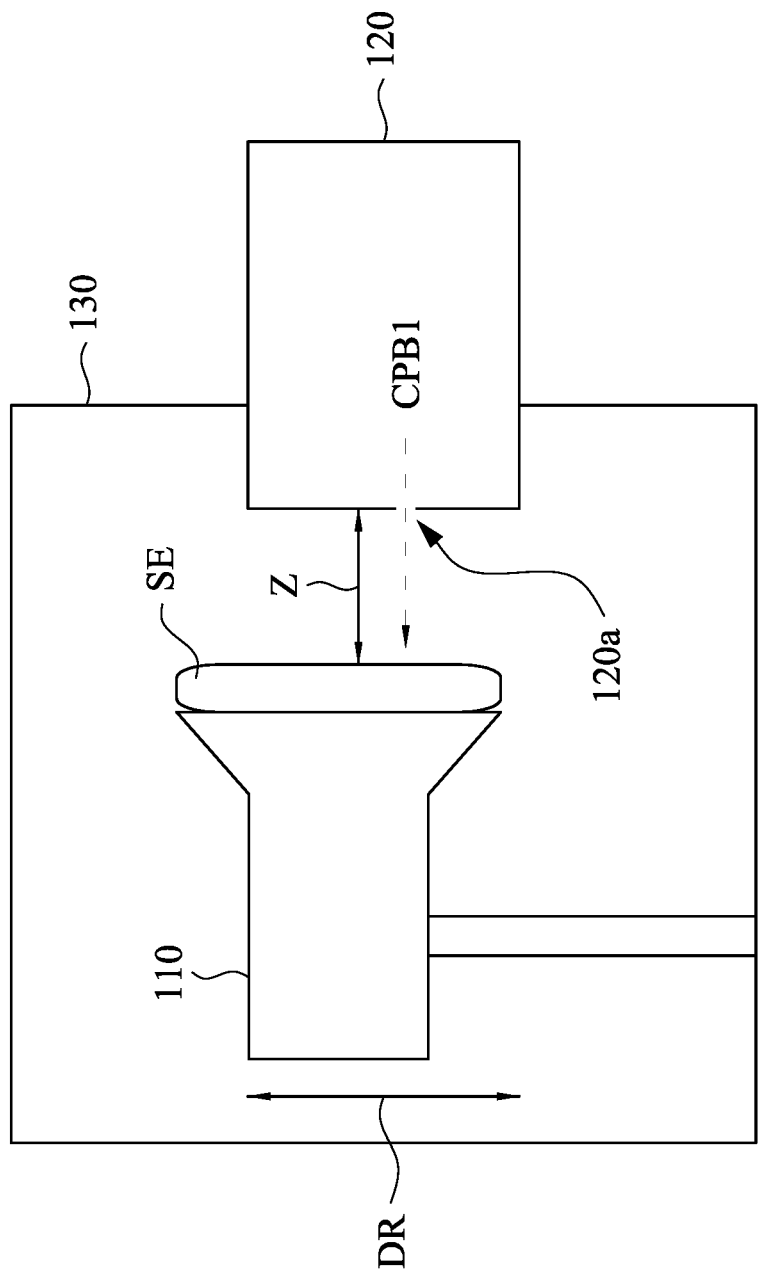
FIG. 1 is a schematic diagram showing equipment for forming gaps in a material layer of a semiconductor device in accordance with an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Terms used herein are only used to describe the specific embodiments, which are not used to limit the claims appended herewith. For example, unless limited otherwise, the term "one" or "the" of the single form may also represent the plural form. The terms such as "first" and "second" are used for describing various devices, areas and layers, etc., though such terms are only used for distinguishing one device, one area or one layer from another device, another area or another layer. Therefore, the first area can also be referred to as the second area without departing from the spirit of the claimed subject matter, and the others are deduced by analogy. In addition, the present disclosure may repeat reference numerals and/or letters in the various examples. This repetition is for the purpose of simplicity and clarity and does not in itself dictate a relationship between the various embodiments and/or configurations discussed. As used herein, the term "and/or" includes any and all combinations of one or more of the associated listed items.

Embodiments of the present disclosure are directed to a method and equipment for forming gaps in a material layer. The equipment includes a supporter configured to support a semiconductor device and an etching device configured to emit directional charged particle beams to etch the semiconductor device. The directional charged particle beams are provided with two energy peaks. In the method for forming gaps in a material layer, the directional charged particle beams are used to etch the material layer to form gaps each having a re-entrance profile.

Referring to FIG. 1, FIG. 1 is a schematic diagram showing equipment for forming gaps in a material layer of a semiconductor device SE. The equipment includes a supporter 110 and an etching device 120. The supporter 110 is located in a chamber 130 and configured to support the semiconductor device SE which is to be etched, and the etching device 120 is configured to etch the semiconductor device SE. In some embodiments, the support 110 is an electrostatic chuck configured to fix the semiconductor device SE on a surface of the support 110. However, embodiments of the present disclosure are not limited thereto.

The etching device 120 is configured to emit directional charged particle beams CPB1 to the semiconductor device SE to etch a material layer of the semiconductor device SE. In some embodiments, each of the directional charged particle beams CPB1 is a plasma beam and emitted from an aperture 120a of the etching device 120. In some embodiments, the gas of the directional charged particle beams CPB1 includes $CH_3F$ and $O_2$. In some embodiments, the gas of the directional charged particle beams CPB1 includes $CH_3F$ and $H_2$. In some embodiments, the gas of the directional charged particle beams CPB1 includes $O_2$ and $N_2$. In some embodiments, the gas of the directional charged particle beams CPB1 includes $H_2$ and $N_2$. In some embodiments, the gas of the directional charged particle beams CPB1 includes $C_4F_6$ and $O_2$. In some embodiments, the gas of the directional charged particle beams CPB1 includes $CF_4$, $CH_3F$ and Ar.

The energy peaks of the directional charged particle beams CPB1 and a vertical distance Z between the semiconductor device SE and the aperture 120a are determined in accordance with a predetermined profile of the gaps to be formed in the material layer of the semiconductor device SE. In some embodiments, the vertical distance Z is in a range between 7 mm to 15 mm. In some embodiments, each of the directional charged particle beams CPB1 is provided to have two peaks at symmetrical angles θ1 and θ2, in which the angle θ1 is in a range between 30 degrees and 1.3 degrees, and the angle θ2 is in a range between −30 degrees and −1.3 degrees. In some embodiments, each of the directional charged particle beams CPB1 is provided to have a single peak at 0 degree.

Further, when the material layer of the semiconductor device SE is etched, the semiconductor device SE is moved upward or downward by the support 110.

Figure 2A:
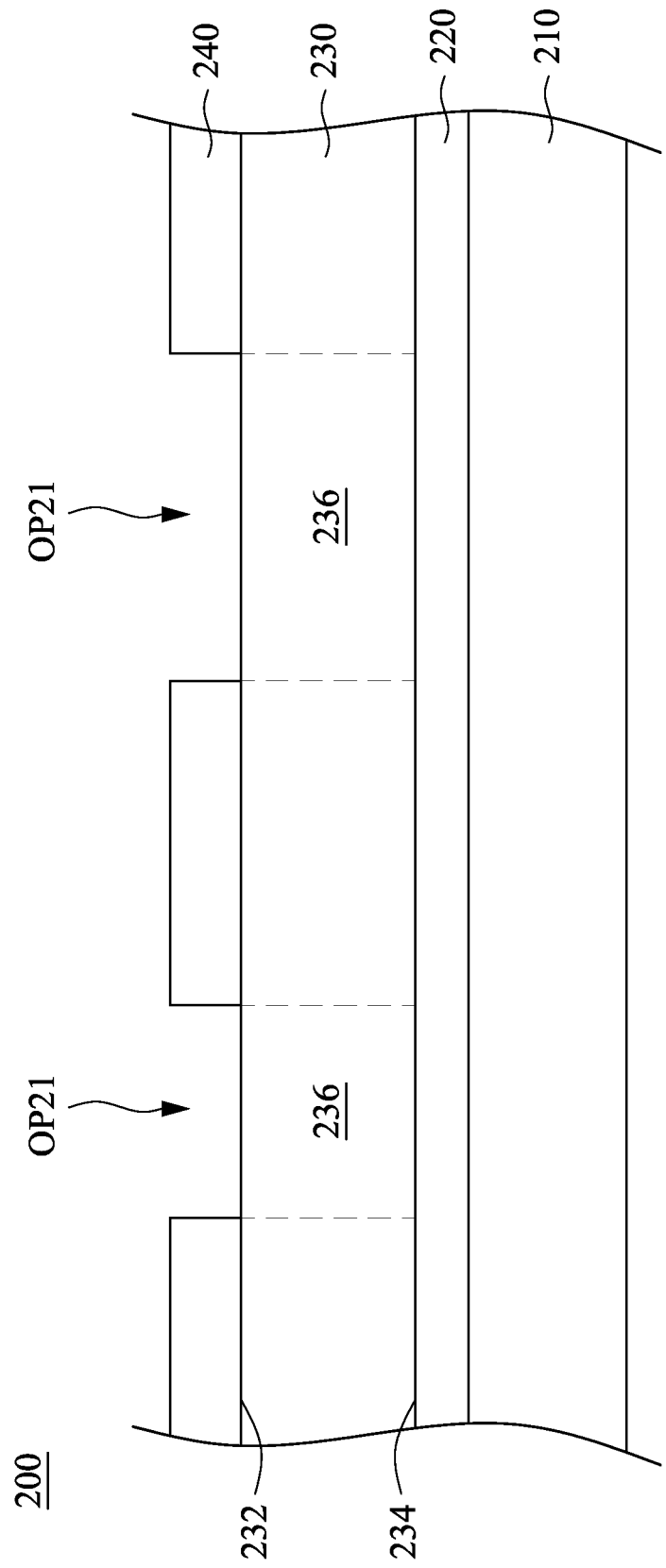
FIGS. 2A-2B and FIGS. 2D-2E are cross-sectional views of intermediate stages showing a method for forming gaps in accordance with some embodiments of the present disclosure.

Referring to FIGS. 2A-2B and FIG. 2D-2E, FIGS. 2A-2B and FIG. 2D-2E are cross-sectional views of intermediate stages showing a method for forming gaps in accordance with some embodiments of the present disclosure. As shown in FIG. 2A, a semiconductor device 200 to be etched is provided. The semiconductor device 200 includes a circuit layer 210, an etch stop layer 220, a material layer 230 and a mask layer 240. The circuit layer 210 may include active circuits or passive circuits. In some embodiments, the circuit layer 210 includes transistor circuits formed on a semiconductor substrate.

The etch stop layer 220 is disposed on the circuit layer 210. The etch stop layer 220 is used to protect the circuit layer 210 from being damaged by subsequent etching processes. In some embodiments, the etch stop layer 220 is formed by titanium nitride, silicon, silicon nitride, or oxide, but embodiments of the present disclosure are not limited thereto.

The material layer 230 is disposed on the etch stop layer 220. The material layer 230 is etched in the subsequent etching processes to form plural gaps for interconnection. The material layer 230 has a top surface 232 and a bottom surface 234. The top surface 232 is adjacent to the mask layer 240, and the bottom surface 234 is adjacent to the etch stop layer 220. In some embodiments, the material layer 230 is formed by silicon nitride, spin-on-carbon, or silicon oxide, but embodiments of the present disclosure are not limited thereto.

The mask layer 240 is disposed on the material layer 230. The mask layer 240 is formed to have openings OP21, thereby exposing portions 236 of the material layer 230. In some embodiments, the mask layer 240 is formed by a photoresist bottom layer, silicon oxide, or silicon nitride, but embodiments of the present disclosure are not limited thereto.

Figure 2B:
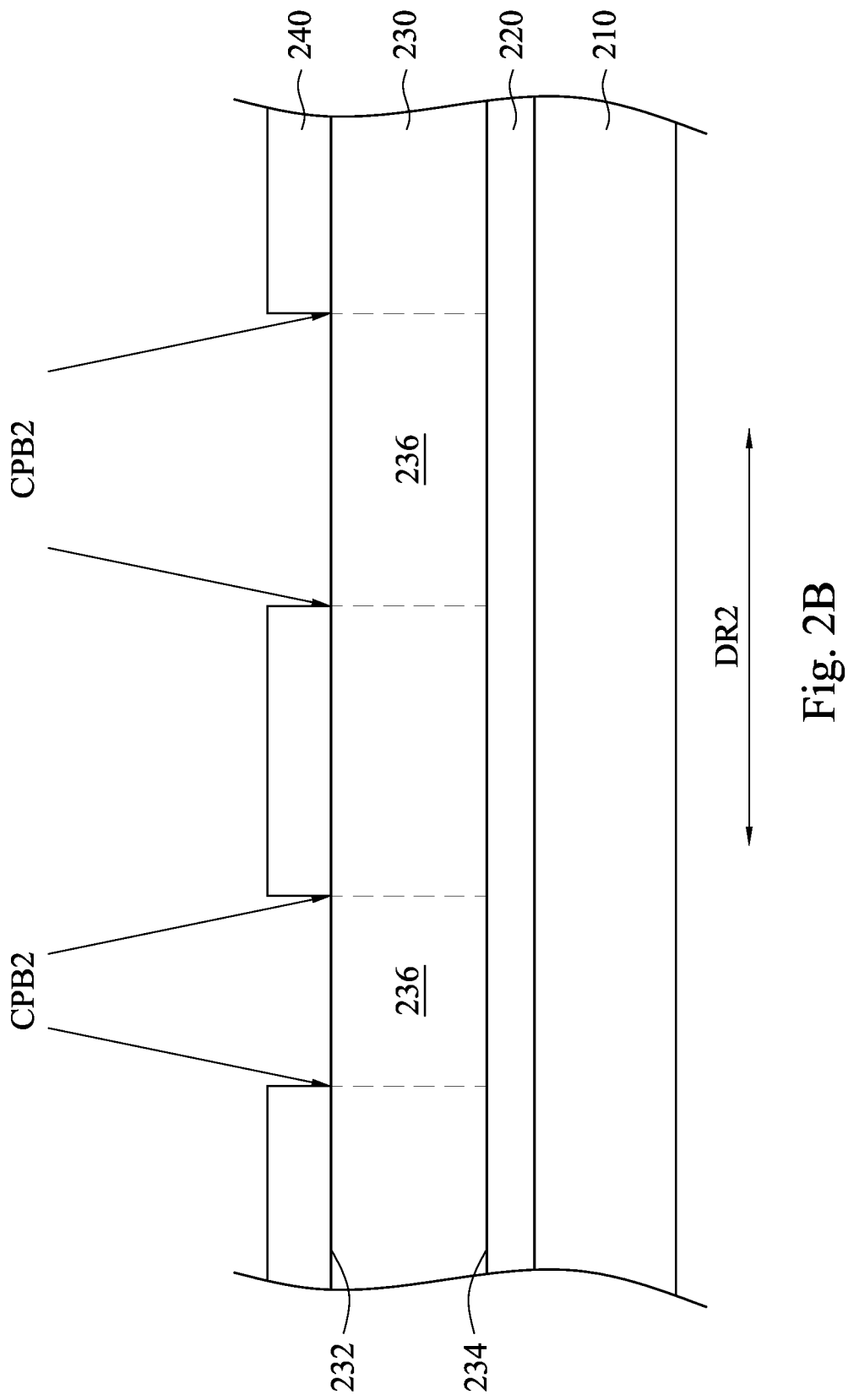
Figure 2C:
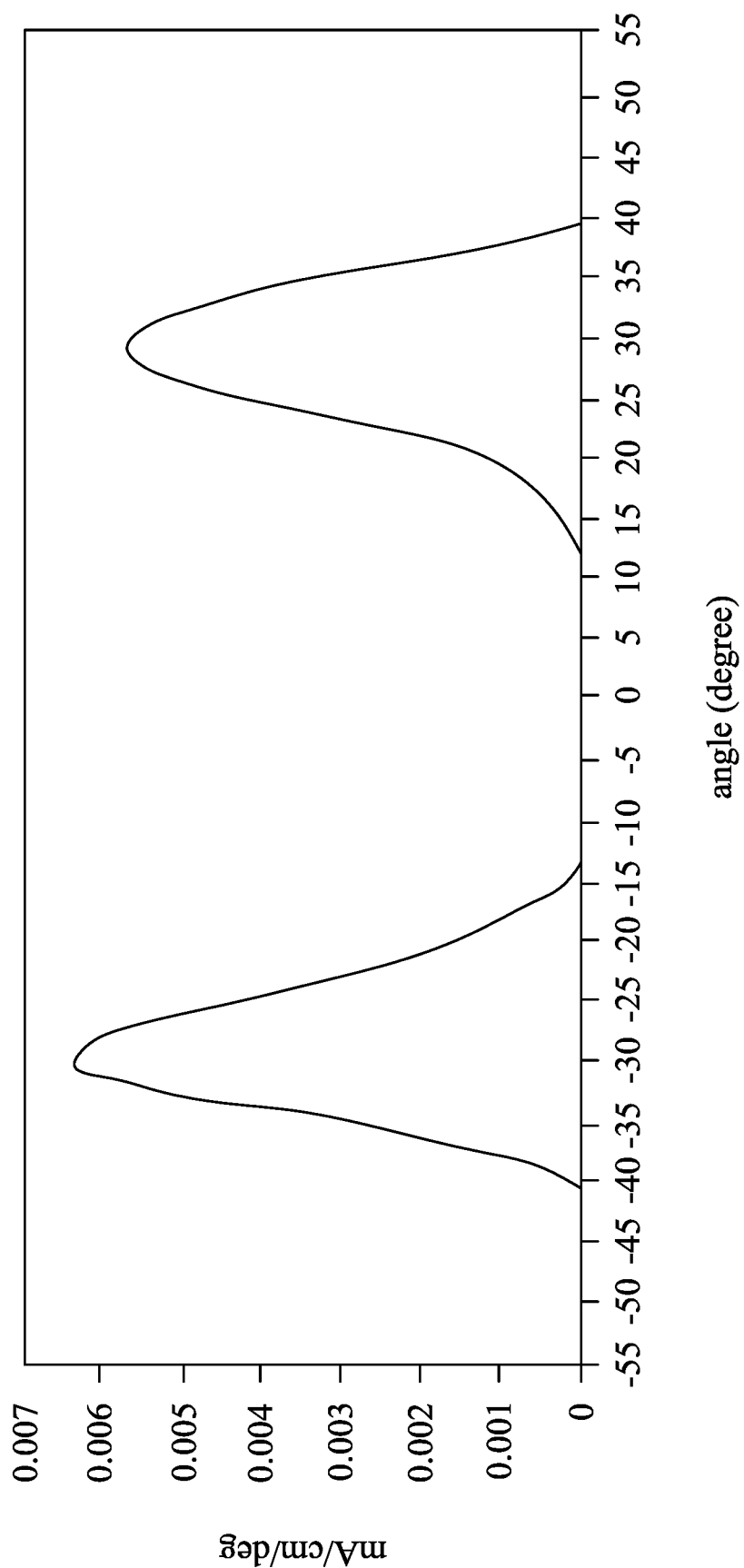
FIG. 2C is a schematic diagram showing a single peak of the directional charged particle beam in accordance with an embodiment of the present disclosure.

As shown in FIG. 2B, the material layer 230 is etched by using directional charged particle beams CPB2. In some embodiments, equipment used to etch the material layer 230 is similar to the equipment shown in FIG. 1. The directional charged particle beams CPB2 are similar to the directional charged particle beams CPB1 and provided to have two peaks as shown in FIG. 2C. In some embodiments, the two peaks correspond to two predetermined angles substantially 30 degrees and −30 degrees. In some embodiments, the two peaks correspond to two predetermined angles substantially 8 degrees and −8 degrees. In some embodiments, the two peaks correspond to two predetermined angles substantially 1.3 degrees and −1.3 degree. Further, the semiconductor device 200 can be moved along a direction DR2 when being etched.

Figure 2D:
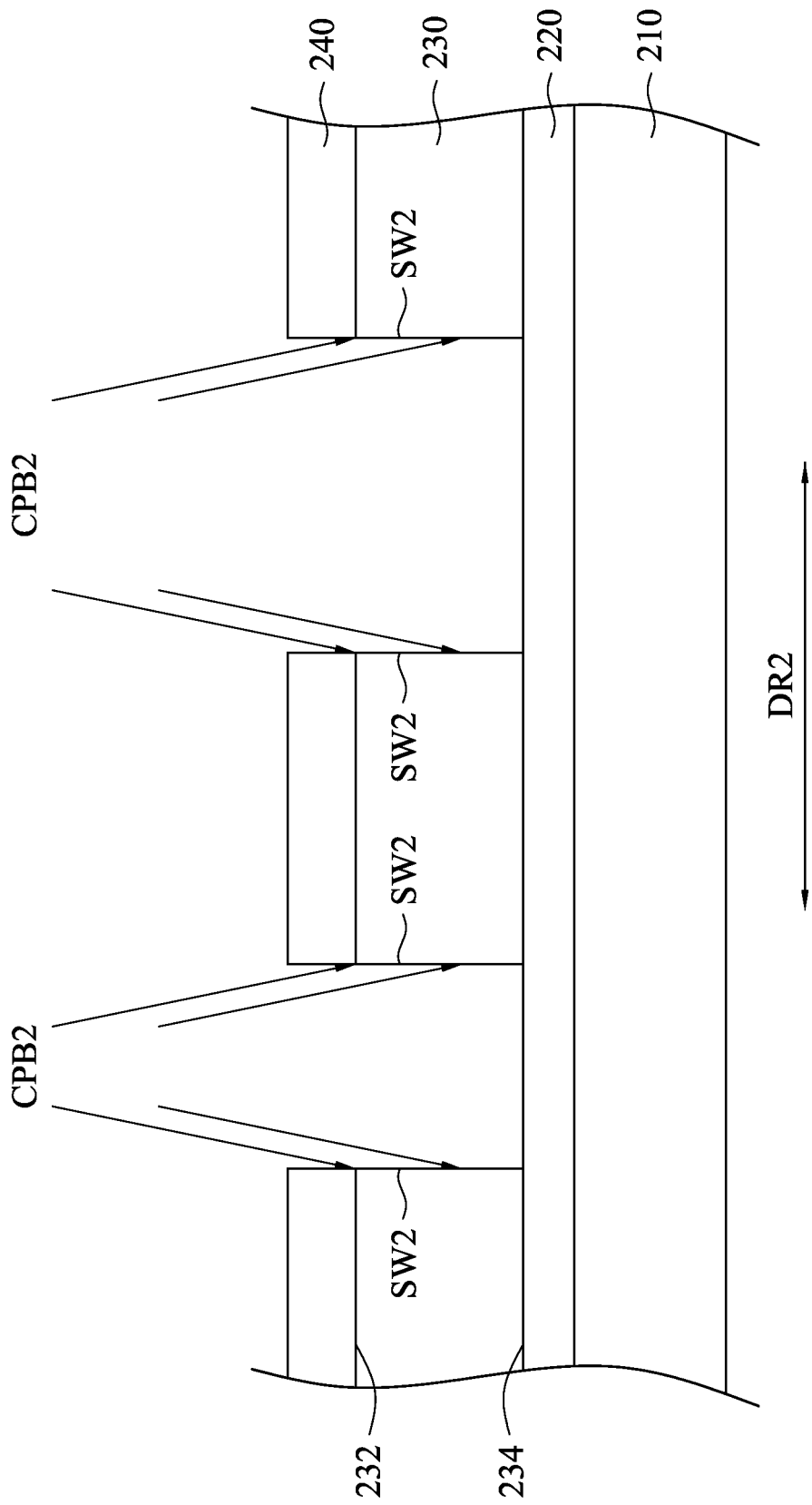
Figure 2E:
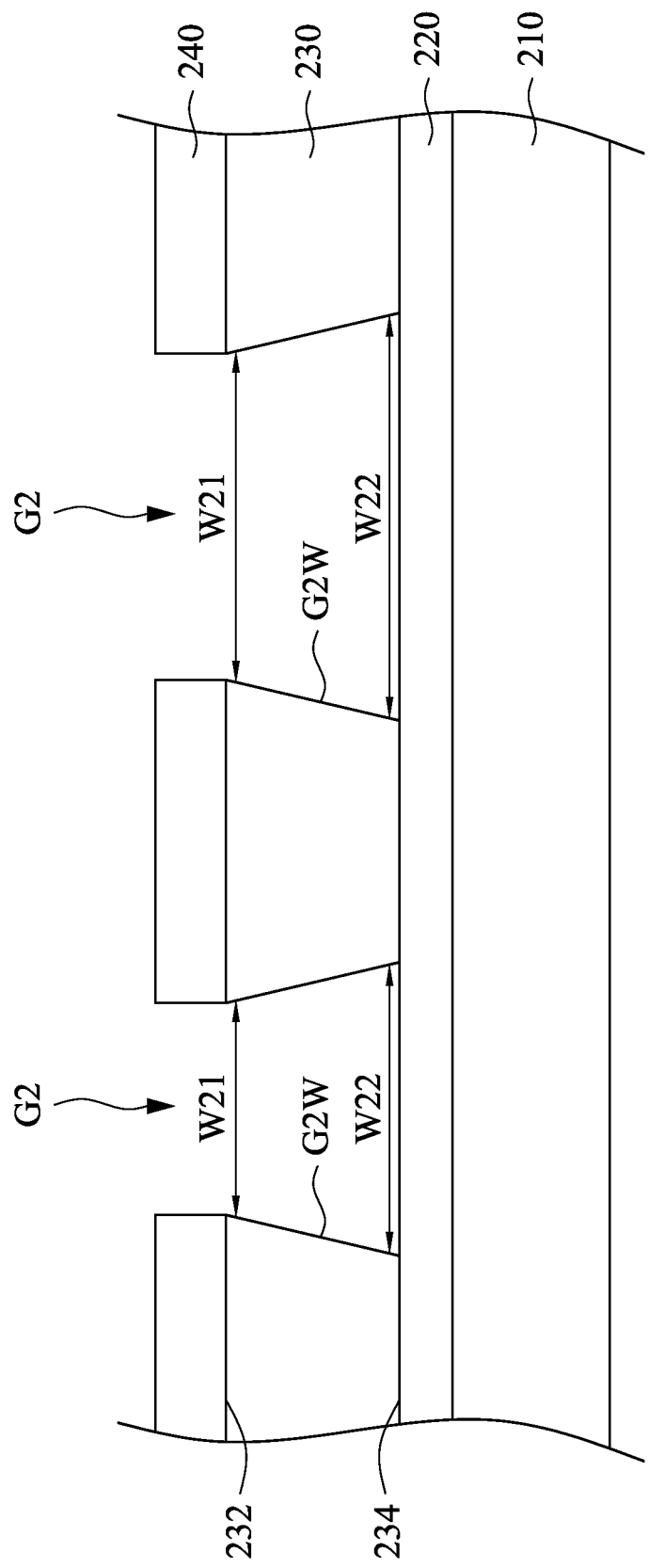

Because the exposed portions 236 of the material layer 230 are not covered by the mask layer 240, and the semiconductor device 200 is moved when being etched, the exposed portions 236 of the material layer 230 are removed, as shown in FIG. 2D. Then, sidewalls SW2 of the material layer 230 are etched by the directional charged particle beams CPB2 to form gaps G2 each having a re-entrance profile in the material layer 230, as shown in FIG. 2E. The gap G2 having the re-entrance profile has a top portion adjacent to the top surface 232 and a bottom portion adjacent to the bottom surface 234, and the top portion of the gap G2 has a width W21 smaller than a width W22 of the bottom portion of the gap G2, because the gap G2 have inclined sidewalls G2W.

Figure 2H:
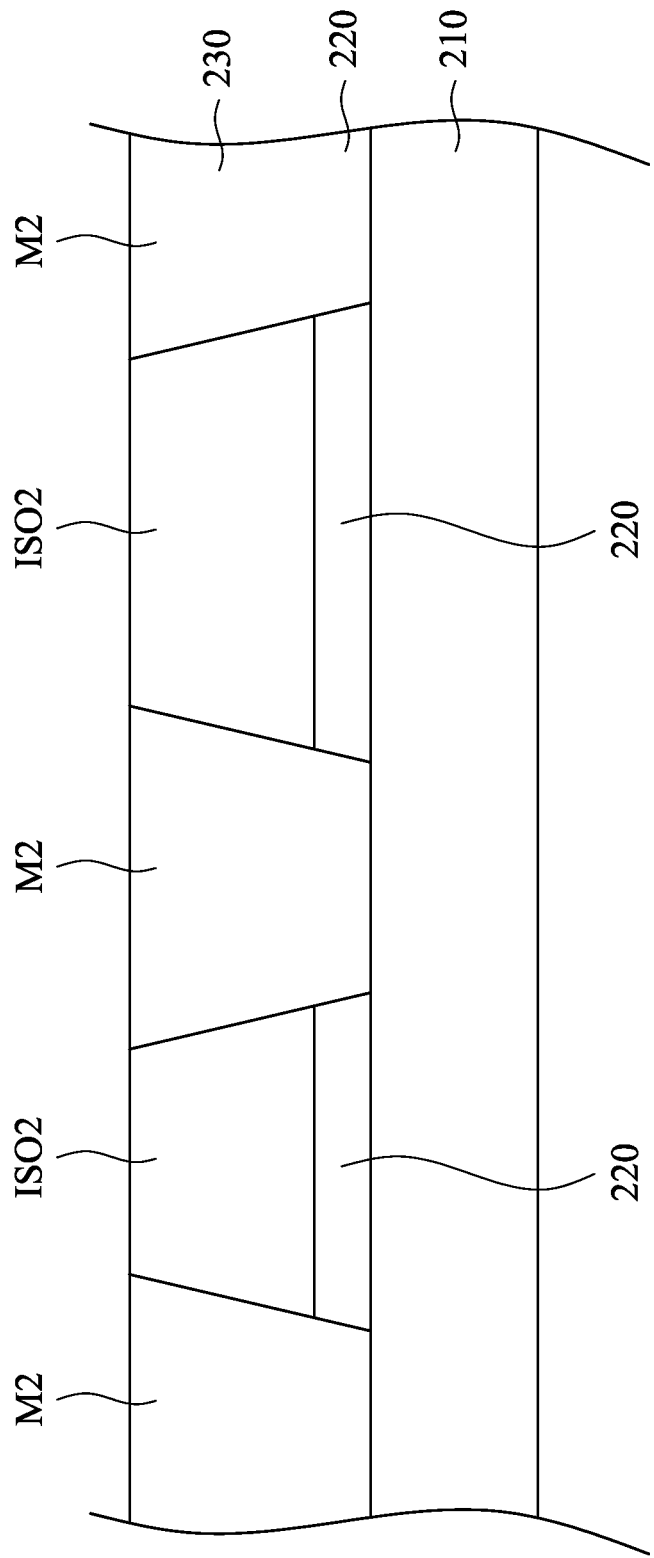

The gaps G2 having the re-entrance profile benefits formation of interconnections. Referring to FIG. 2F to FIG. 2H, FIG. 2F to FIG. 2H are cross-sectional views showing filling of metal material in accordance with an embodiment of the present disclosure. After the gaps G2 are formed, isolation layers ISO2 are formed in the gaps G2, as shown in FIG. 2F. In some embodiments, isolation layers ISO2 are formed from silicon nitride, but embodiments of the present disclosure are not limited thereto. Thereafter, the material layer 230 and the etch stop layer 220 located under the material layer 230 are sequentially removed, thereby forming plural openings (for example, the opening OP22) between the isolation layers ISO2, as shown in FIG. 2G. Then, the openings located between isolation layers ISO2 are filled with the metal material M2, as shown FIG. 2H. Because the isolation layers ISO2 in the gaps G2 are formed to have the re-entrance profile, the metal material M2 located between the isolation layers ISO2 is formed to have a taper profile and without void or seam. Therefore, gaps G2 having the re-entrance profile benefits the filling of the metal material M2.

Figure 3A:
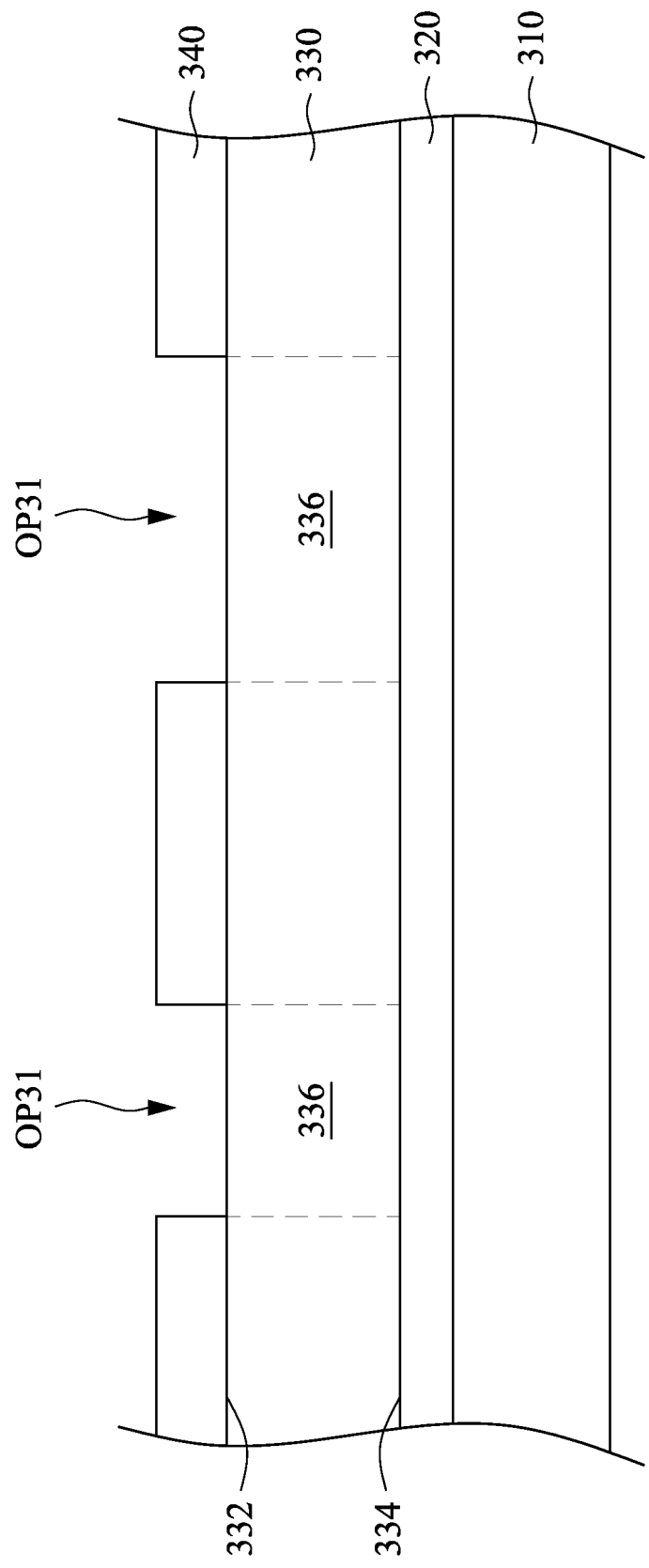
FIGS. 3A-3B and FIGS. 3D-3E are cross-sectional views of intermediate stages showing a method for forming gaps in accordance with an embodiment of the present disclosure.

Referring to FIGS. 3A-3B and FIGS. 3D-3E, FIGS. 3A-3B and FIGS. 3D-3E are cross-sectional views of intermediate stages showing a method for forming gaps in accordance with an embodiment of the present disclosure. As shown in FIG. 3A, a semiconductor device 300 to be etched is provided. The semiconductor device 300 includes a circuit layer 310, an etch stop layer 320, a material layer 330 and a mask layer 340. The circuit layer 310 may include active circuits or passive circuits. In some embodiments, the circuit layer 310 includes transistor circuits formed on a semiconductor substrate.

The etch stop layer 320 is disposed on the circuit layer 310. The etch stop layer 320 is used to protect the circuit layer 310 from being damaged by subsequent etching processes. In some embodiments, the etch stop layer 320 is formed by titanium nitride, silicon, silicon nitride, or oxide, but embodiments of the present disclosure are not limited thereto.

The material layer 330 is disposed on the etch stop layer 320. The material layer 330 is etched in the subsequent etching processes to form plural gaps for interconnection. The material layer 330 has a top surface 332 and a bottom surface 334. The top surface 332 is adjacent to the mask layer 340, and the bottom surface 334 is adjacent to the etch stop layer 320. In some embodiments, the material layer 330 is formed by silicon nitride, spin-on-carbon, or silicon oxide, but embodiments of the present disclosure are not limited thereto.

The mask layer 340 is disposed on the material layer 330. The mask layer 340 is formed to have openings OP31, thereby exposing portions 332 of the material layer 330. In some embodiments, the mask layer 340 is formed by a photoresist bottom layer, silicon oxide, or silicon nitride, but embodiments of the present disclosure are not limited thereto.

Figure 3B:
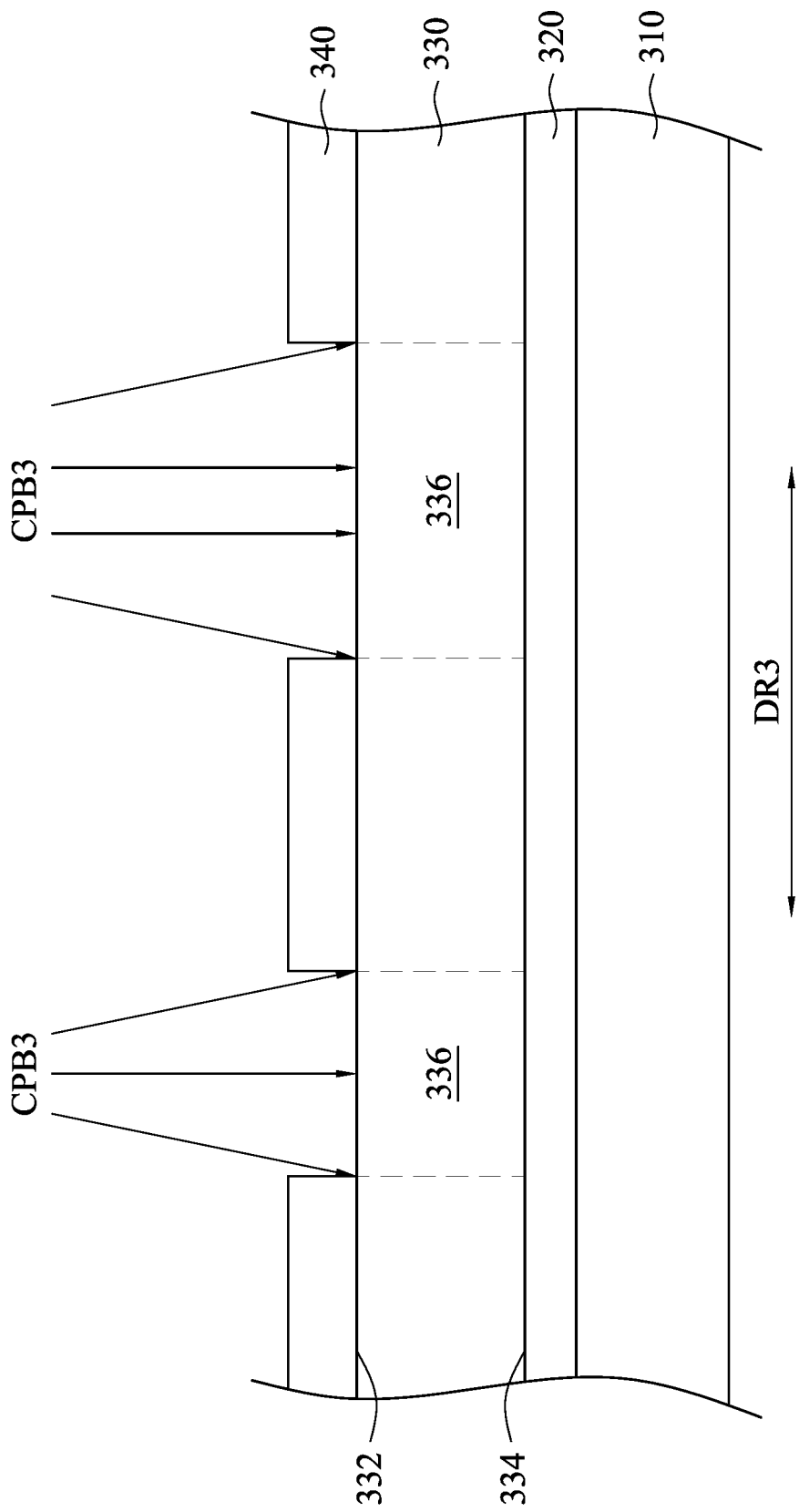
Figure 3C:
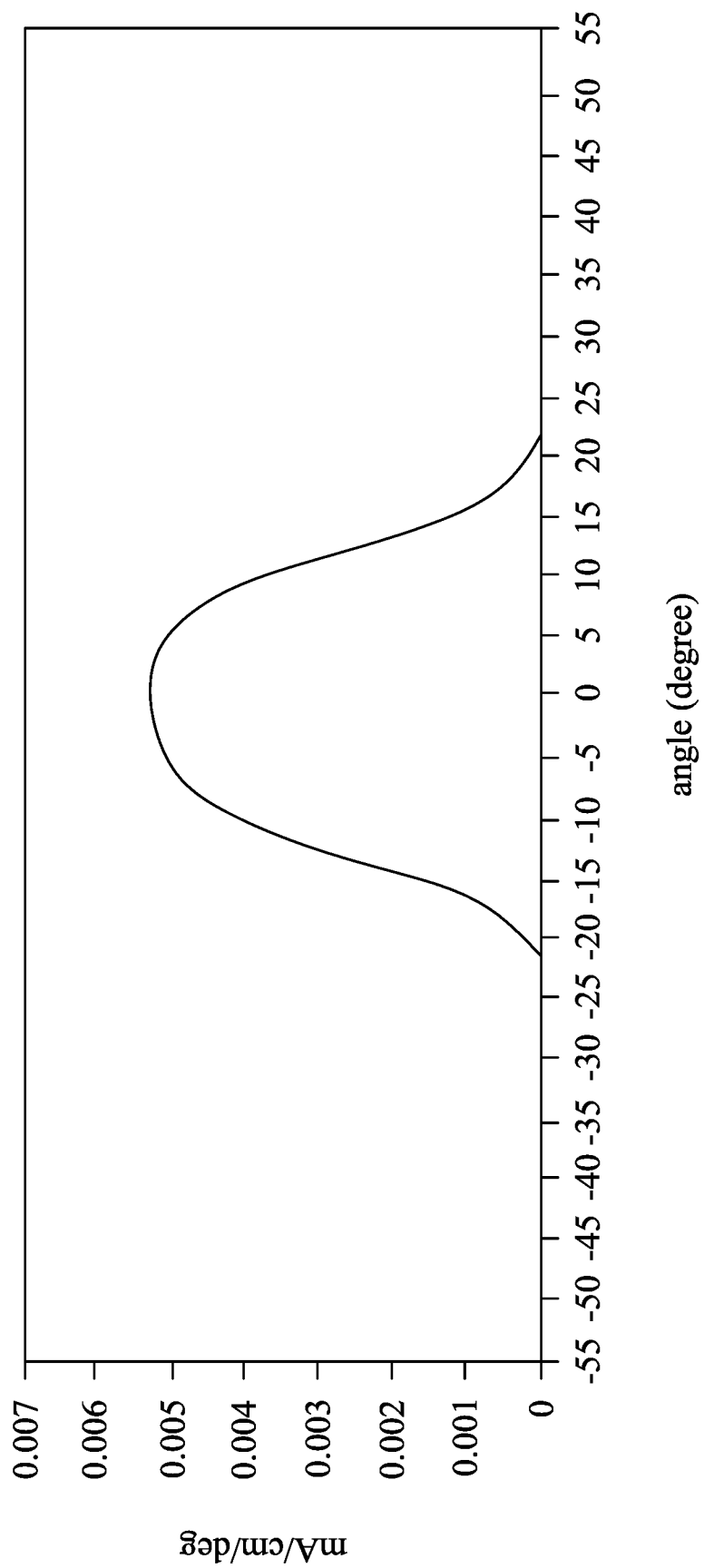
FIG. 3C is a schematic diagram showing a single peak of the directional charged particle beam in accordance with an embodiment of the present disclosure.

As shown in FIG. 3B, the material layer 330 is etched by using directional charged particle beams CPB3. In some embodiments, equipment used to etch the material layer 330 is similar to the equipment shown in FIG. 1. The directional charged particle beams CPB3 are similar to the directional charged particle beams CPB1, in which each of the directional charged particle beams CPB3 is provided to have a single peak as shown in FIG. 3C. The single peak corresponds to a predetermined angle substantially 0 degree. Further, the semiconductor device 300 can be moved along a direction DR3 when being etched.

Figure 3D:
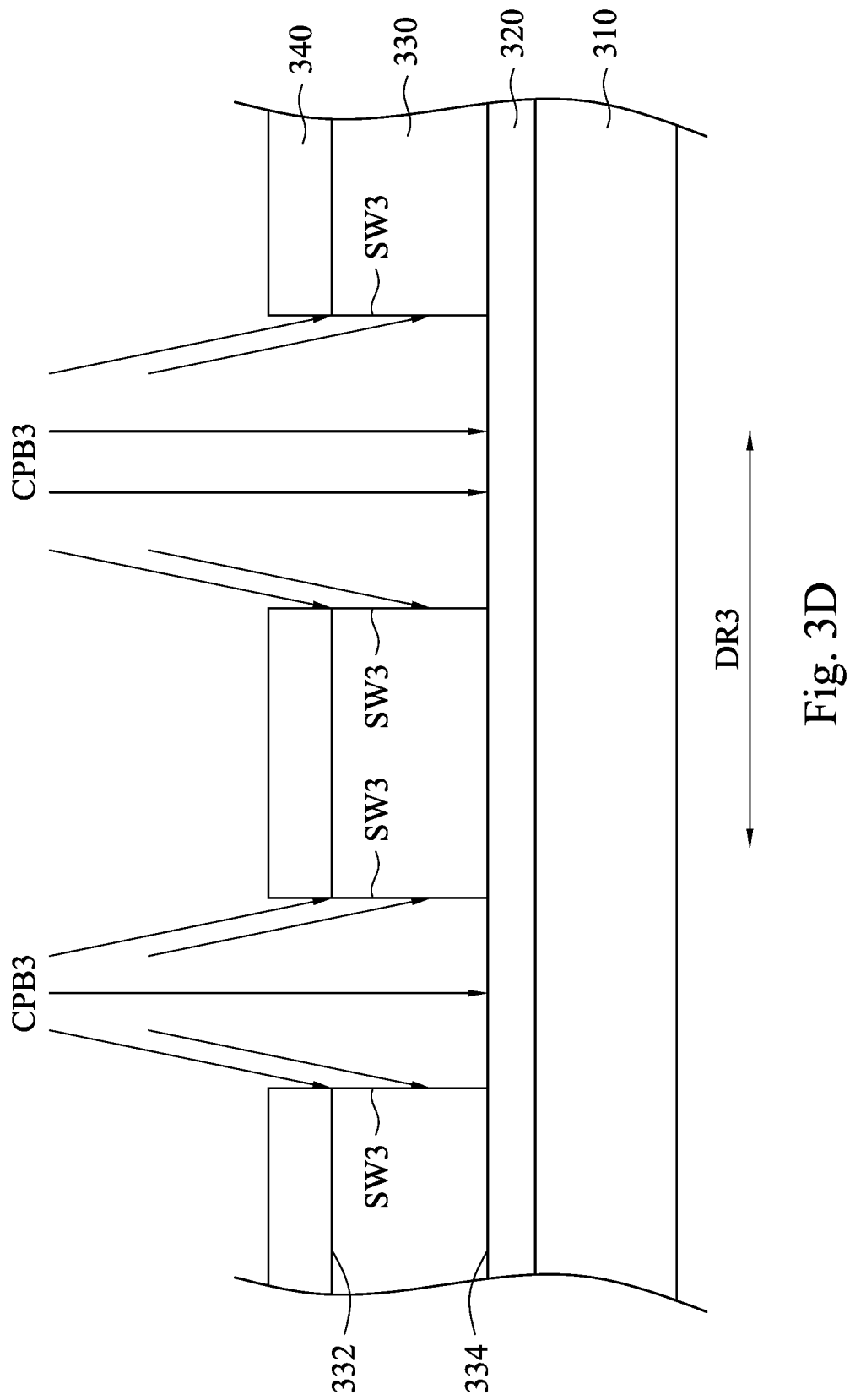
Figure 3E:
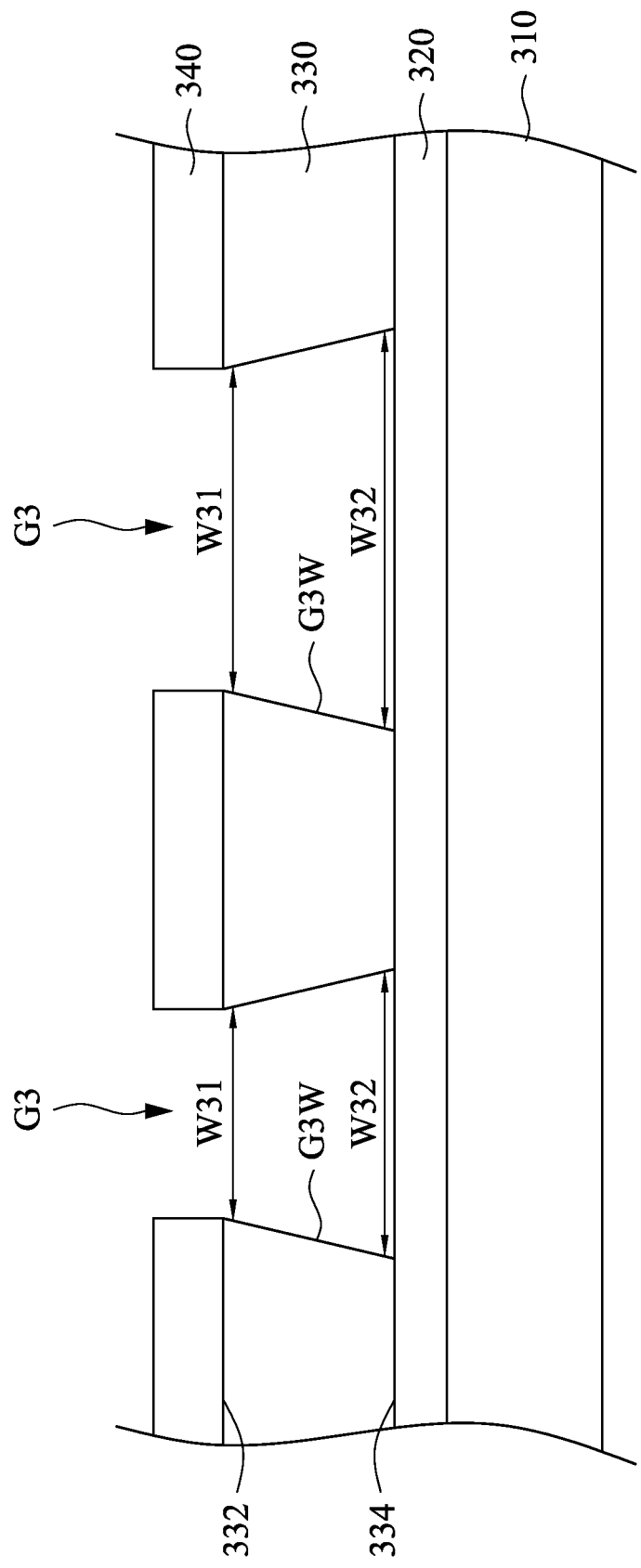

Because the exposed portions 336 of the material layer 330 are not covered by the mask layer 340, and the semiconductor device 300 is moved when being etched, the exposed portions 336 of the material layer 330 are removed, as shown in FIG. 3C. Then, sidewalls SW3 of the material layer 330 are etched by the directional charged particle beams CPB3 to form gaps G3 each having a re-entrance profile in the material layer 330, as shown in FIG. 3E. The gap G3 having the re-entrance profile has a top portion adjacent to the top surface 332 and a bottom portion adjacent to the bottom surface 234, and the top portion of the gap G3 has a width W31 smaller than a width W32 of the bottom portion of the gap G3, because the gap G3 have inclined sidewalls G3W.

Similar to the gaps G2, the gaps G3 having the re-entrance profile also benefit formation of interconnections.

Figure 4A:
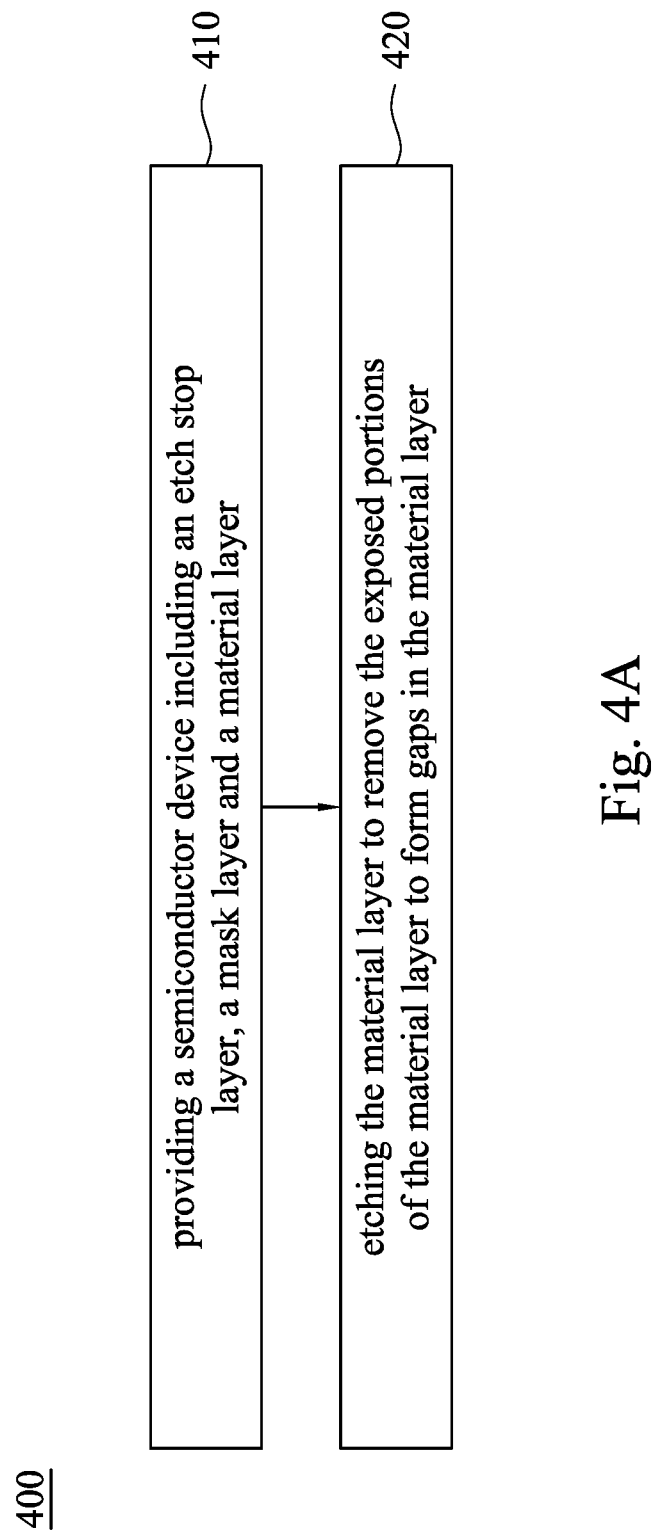
FIG. 4A is a flow chart of a method for forming gaps in a material layer in accordance with an embodiment of the present disclosure.

Referring to FIG. 4A, FIG. 4A is a flow chart of a method 400 for forming gaps in a material layer in accordance with an embodiment of the present disclosure. The method 400 begins at operation 410. In operation 410, a semiconductor device including an etch stop layer, a material layer and a mask layer is provided. For example, the semiconductor device 200 including the etch stop layer 220, the material layer 230 and the mask layer 240 is provided as shown in FIG. 2A. For another example, the semiconductor device 300 including the etch stop layer 320, the material layer 330 and the mask layer 340 is provided as shown in FIG. 3A.

Then, in operation 420, a material layer of the semiconductor device is etched to remove exposed portions of the material layer. For example, the material layer 230 is etched to remove the exposed portions 236 of the material layer 230 as shown in FIG. 2E. For another example, the material layer 330 is etched to remove the exposed portions 336 of the material layer 330 as shown in FIG. 3E.

Figure 4B:
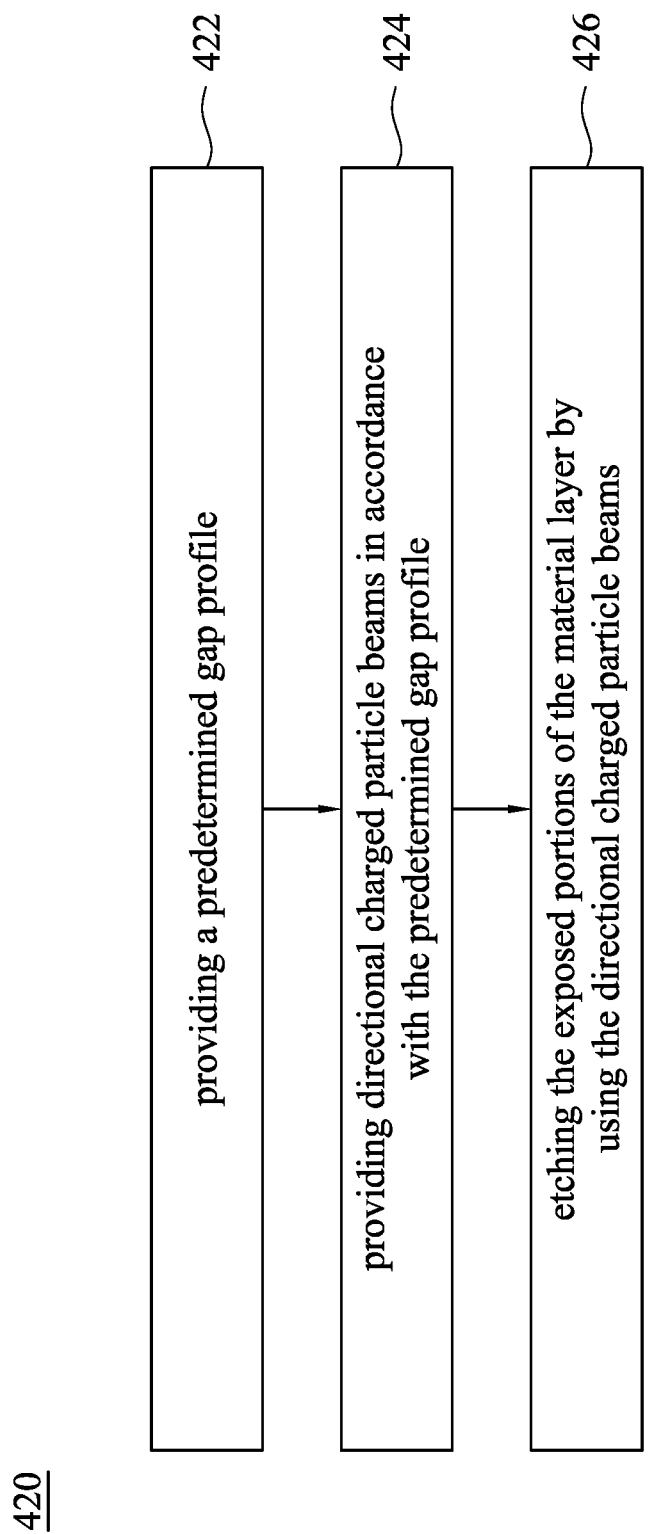
FIG. 4B is a flow chart of the operation for etching the material layer in accordance with an embodiment of the present disclosure.

Referring to FIG. 4B, FIG. 4B is a flow chart of operation 420 for etching the material layer. Operation 420 begins at operation 422. In operation 422, a predetermined gap profile is provided. In some embodiments, the predetermined gap profile is the re-entrance profile, but embodiments of the present disclosure are not limited thereto. Then, in operation 424, directional charged particle beams are provided in accordance with the predetermined gap profile. For example, the directional charged particle beams CPB2 having two peaks are provided. For another example, the directional charged particle beams CPB3 having a single peak are provided.

Further, in some embodiments, the vertical distance Z (shown in FIG. 1) between the semiconductor device and the aperture is determined in accordance with the predetermined gap profile, and the directional charged particle beams CPB2 are provided in accordance with the vertical distance Z and the predetermined gap profile. In some embodiments, the directional charged particle beams CPB2 having two peaks corresponding to two angles substantially 30 degrees and −30 degrees are provided when the vertical distance Z is substantially 15 mm. In some embodiments, the directional charged particle beams CPB2 having two peaks corresponding to two angles substantially 8 degrees and −8 degrees are provided when the vertical distance Z is substantially 8.5 mm. In some embodiments, the directional charged particle beams CPB2 having two peaks corresponding to two angles substantially 1.3 degrees and −1.3 degrees are provided when the vertical distance Z is substantially 7 mm.

Thereafter, in operation 426, the exposed portions of the material layer are etched. For example, the exposed portions 236 of the material layer 230 are etched by using the directional charged particle beams CPB2, as shown in FIG. 2B and FIG. 2D. For another example, the exposed portions 336 of the material layer 330 are etched by using the directional charged particle beams CPB3, as shown in FIG. 3B and FIG. 3D.

Figure 5A:
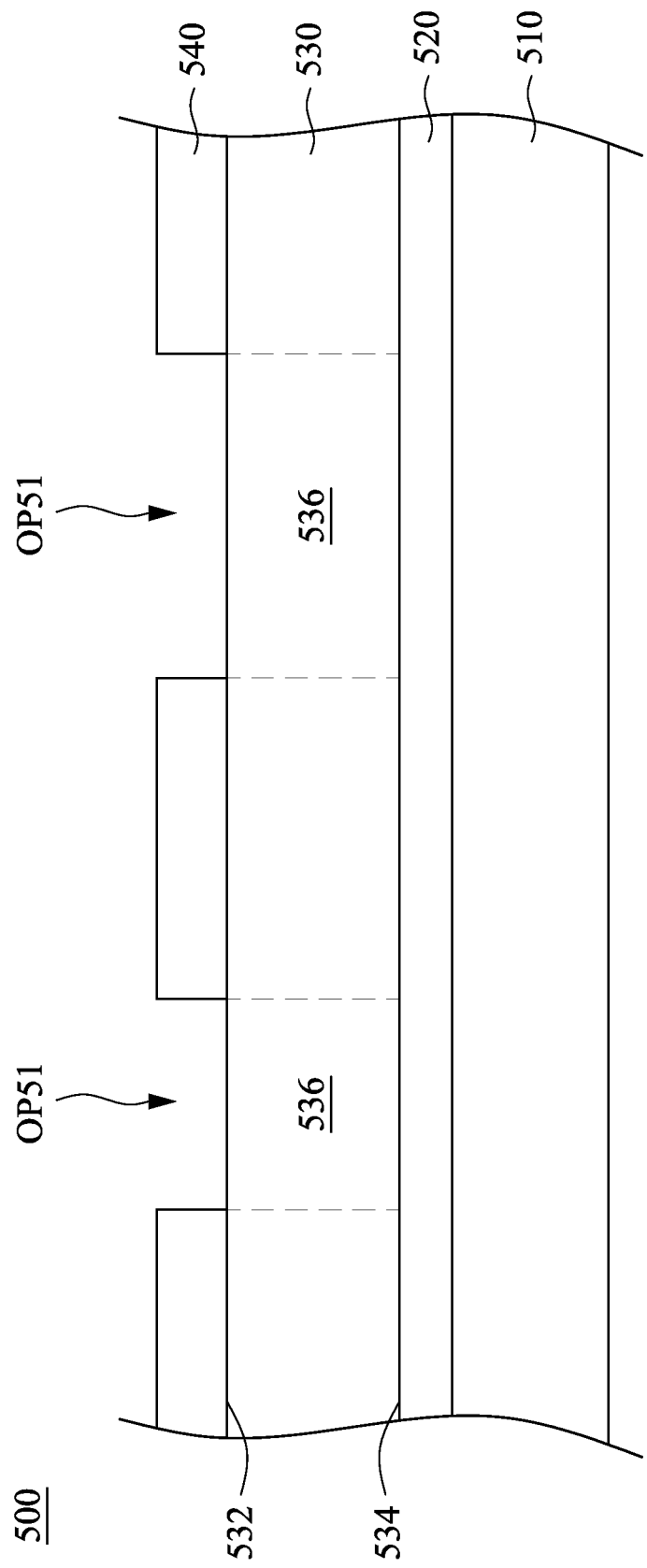
FIG. 5A to FIG. 5D are cross-sectional views of intermediate stages showing a method for forming gaps in accordance with an embodiment of the present disclosure.

Referring to FIG. 5A to FIG. 5D, FIG. 5A to FIG. 5D are cross-sectional views of intermediate stages showing a method for forming gaps in accordance with an embodiment of the present disclosure. As shown in FIG. 5A, a semiconductor device 500 to be etched is provided. The semiconductor device 500 includes a circuit layer 510, an etch stop layer 520, a material layer 530 and a mask layer 540. The circuit layer 510 may include active circuits or passive circuits. In some embodiments, the circuit layer 510 includes transistor circuits formed on a semiconductor substrate.

The etch stop layer 520 is disposed on the circuit layer 510. The etch stop layer 520 is used to protect the circuit layer 510 from being damaged by subsequent etching processes. In some embodiments, the etch stop layer 520 is formed by titanium nitride, silicon, silicon nitride, or oxide, but embodiments of the present disclosure are not limited thereto.

The material layer 530 is disposed on the etch stop layer 520. The material layer 530 is etched in the subsequent etching processes to form plural gaps for interconnection. The material layer 530 has a top surface 532 and a bottom surface 534. The top surface 532 is adjacent to the mask layer 540, and the bottom surface 534 is adjacent to the etch stop layer 520. In some embodiments, the material layer 530 is formed by silicon nitride, spin-on-carbon, or silicon oxide, but embodiments of the present disclosure are not limited thereto.

The mask layer 540 is disposed on the material layer 530. The mask layer 540 is formed to have openings OP51, thereby exposing portions 536 of the material layer 530. In some embodiments, the mask layer 540 is formed by a photoresist bottom layer, silicon oxide, or silicon nitride, but embodiments of the present disclosure are not limited thereto.

Figure 5B:
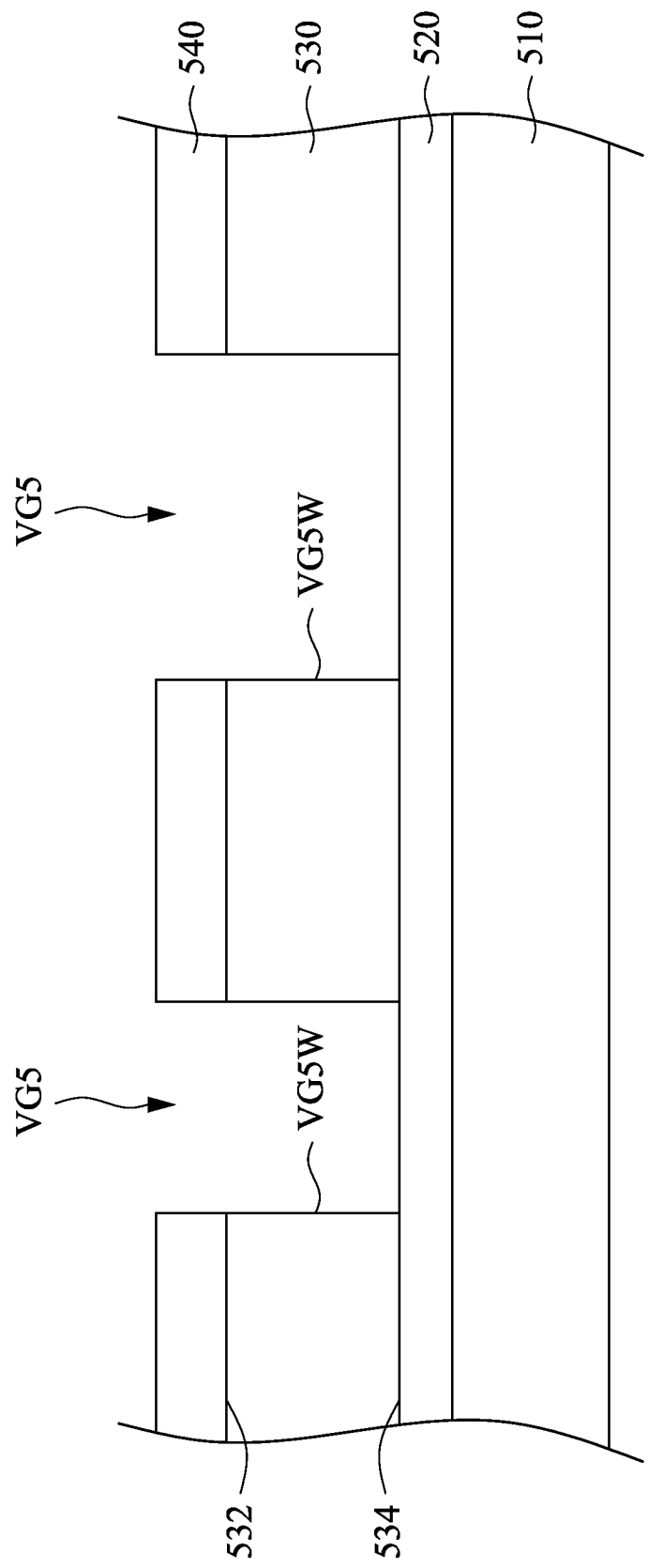

As shown in FIG. 5B, the material layer 530 is etched to form plural vertical gaps VG5 in the material layer 530. Because the exposed portions 536 of the material layer 530 are not covered by the mask layer 540, the exposed portions 536 of the material layer 530 are removed, thereby forming the vertical gaps VG5. Each of the vertical gaps VG5 has a vertical sidewall VG5W orthogonal to the top surface 532 and the bottom surface 534 of the material layer 530, and the vertical sidewalls VG5W extend from the bottom surface 534 of the material layer 530 to the top surface 532 of the material layer 530. In some embodiments, the material layer 530 is etched by using a wet etching process to form the vertical gaps VG5, but embodiments of the present invention are not limited thereto.

Figure 5C:
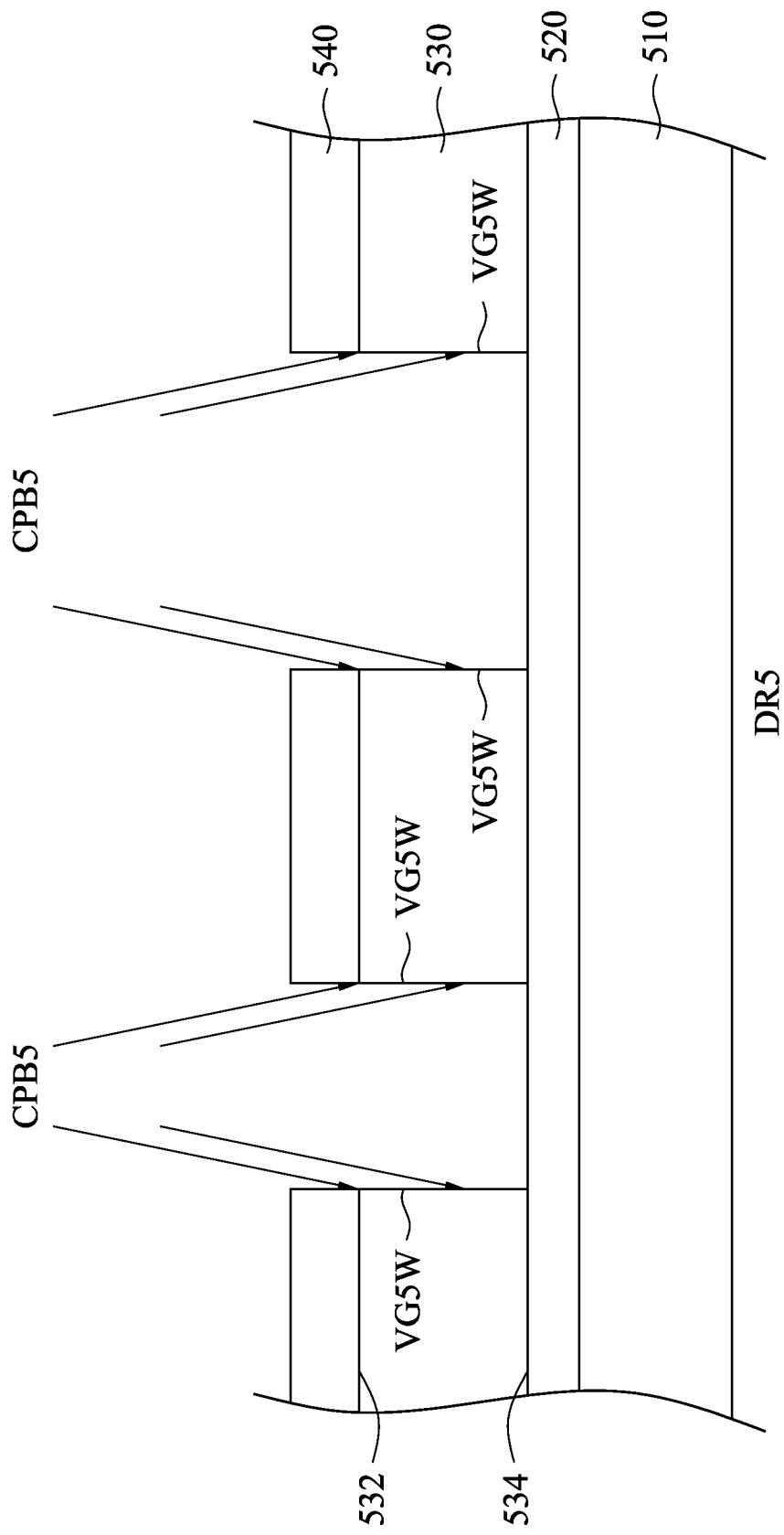

As shown in FIG. 5C, the vertical sidewalls VG5W of the vertical gaps VG5 are etched by using directional charged particle beams CPB5. In some embodiments, equipment used to etch the vertical sidewalls VG5W is similar to the equipment shown in FIG. 1. The directional charged particle beams CPB5 are similar to the directional charged particle beams CPB1, in which each of the directional charged particle beams CPB5 is provided to have two peaks as shown in FIG. 2C. In some embodiments, the two peaks correspond to two angles substantially 30 degrees and −30 degrees. In some embodiments, the two peaks correspond to two angles substantially 8 degrees and −8 degrees. In some embodiments, the two peaks correspond to two angles substantially 1.3 degrees and −1.3 degree. Further, the semiconductor device 500 can be moved along a direction DR5 when being etched by the directional charged particle beams CPB5.

Figure 5D:
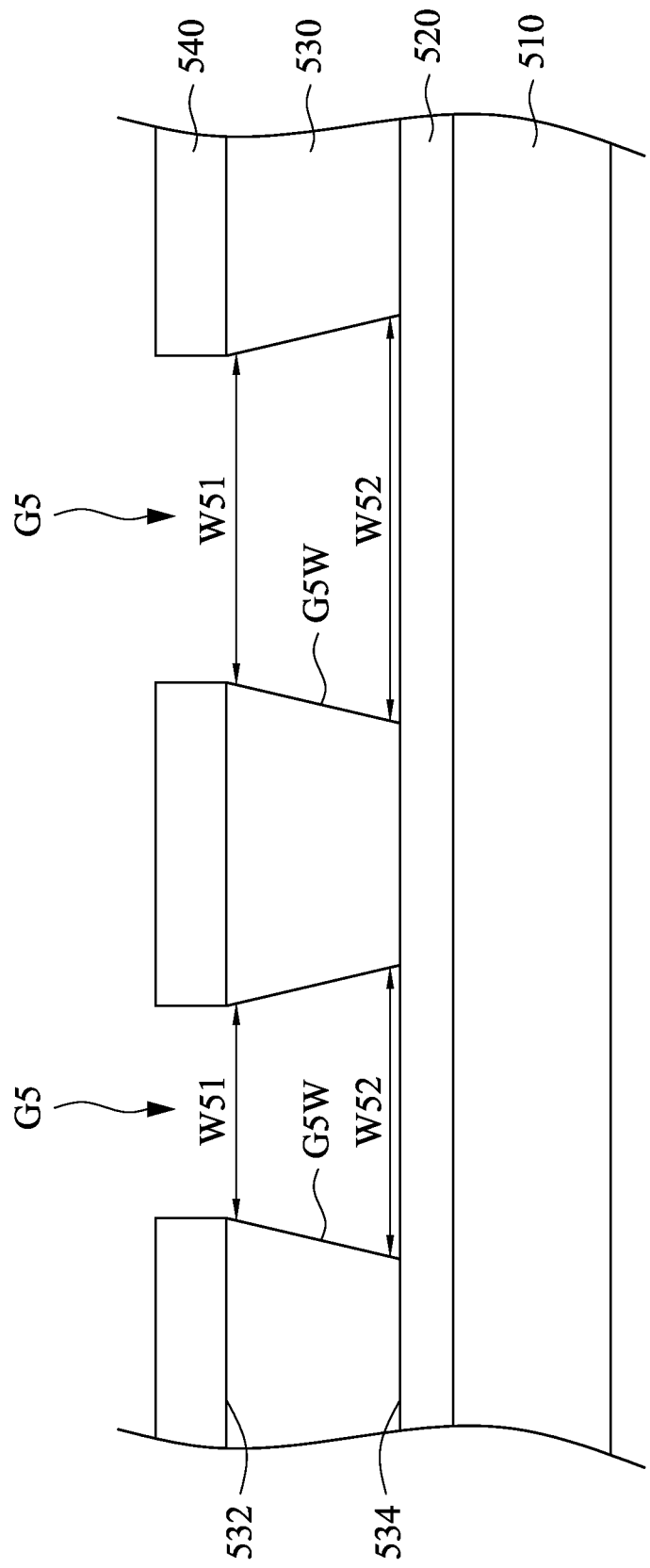

Then, after the sidewalls VG5W of the vertical gaps VG5 are etched, gaps G5 each having a re-entrance profile are formed as shown in FIG. 5D. The gap G5 having the re-entrance profile has a top portion adjacent to the top surface 532 and a bottom portion adjacent to the bottom surface 534, and the top portion of the gap G5 has a width W51 smaller than a width W52 of the bottom portion of the gap G5, because the gap G5 have inclined sidewalls G5W.

Similar to the gaps G2, the gaps G5 having the re-entrance profile also benefit formation of interconnections.

Figure 6A:
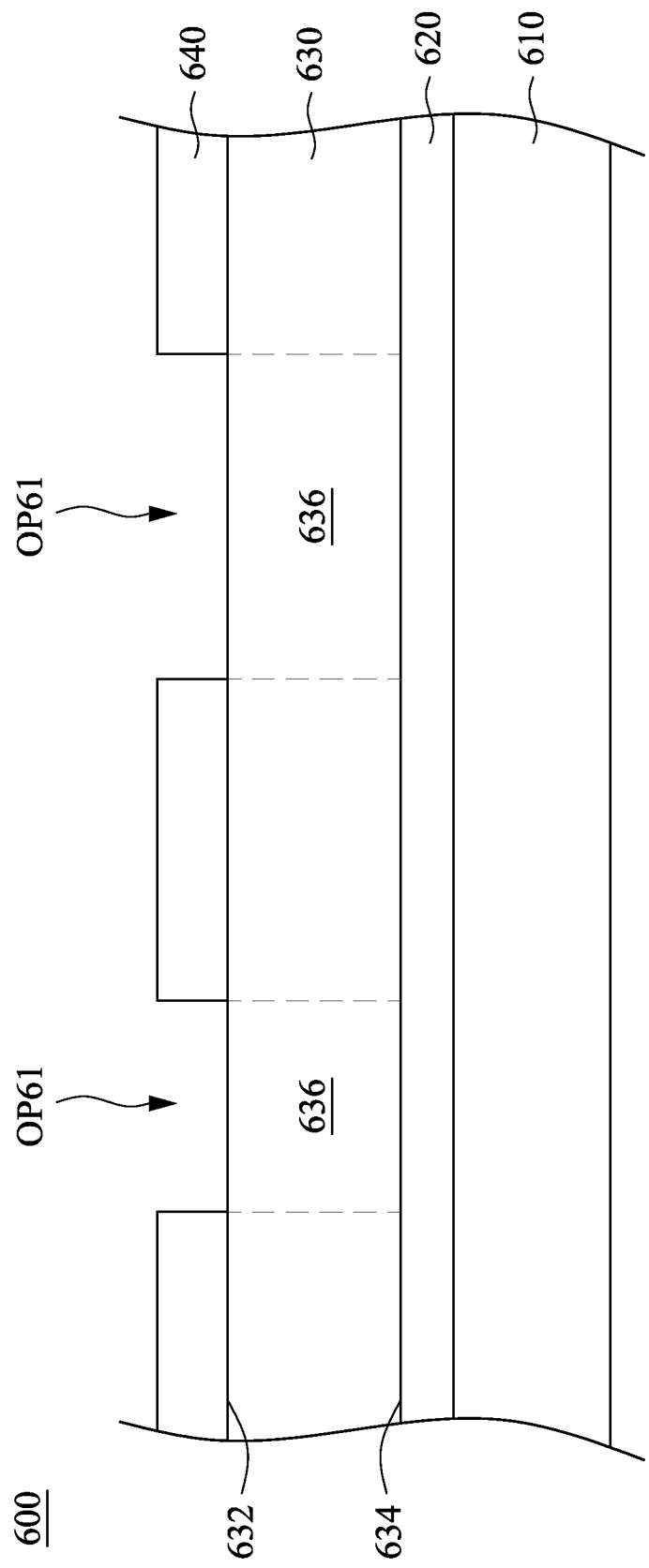
FIG. 6A to FIG. 6D are cross-sectional views of intermediate stages showing a method for forming gaps in accordance with an embodiment of the present disclosure.

Referring to FIG. 6A to FIG. 6D, FIG. 6A to FIG. 6D are cross-sectional views of intermediate stages showing a method for forming gaps in accordance with an embodiment of the present disclosure. As shown in FIG. 6A, a semiconductor device 600 to be etched is provided. The semiconductor device 600 includes a circuit layer 610, an etch stop layer 620, a material layer 630 and a mask layer 640. The circuit layer 610 may include active circuits or passive circuits. In some embodiments, the circuit layer 610 includes transistor circuits formed on a semiconductor substrate.

The etch stop layer 620 is disposed on the circuit layer 610. The etch stop layer 620 is used to protect the circuit layer 610 from being damaged by subsequent etching processes. In some embodiments, the etch stop layer 620 is formed by titanium nitride, silicon, silicon nitride, or oxide, but embodiments of the present disclosure are not limited thereto.

The material layer 630 is disposed on the etch stop layer 620. The material layer 630 is etched in the subsequent etching processes to form plural gaps for interconnection. The material layer 630 has a top surface 632 and a bottom surface 634. The top surface 632 is adjacent to the mask layer 640, and the bottom surface 634 is adjacent to the etch stop layer 620. In some embodiments, the material layer 630 is formed by silicon nitride, spin-on-carbon, or silicon oxide, but embodiments of the present disclosure are not limited thereto.

The mask layer 640 is disposed on the material layer 630. The mask layer 640 is formed to have openings OP61, thereby exposing portions 636 of the material layer 630. In some embodiments, the mask layer 640 is formed by a photoresist bottom layer, silicon oxide, or silicon nitride, but embodiments of the present disclosure are not limited thereto.

Figure 6B:
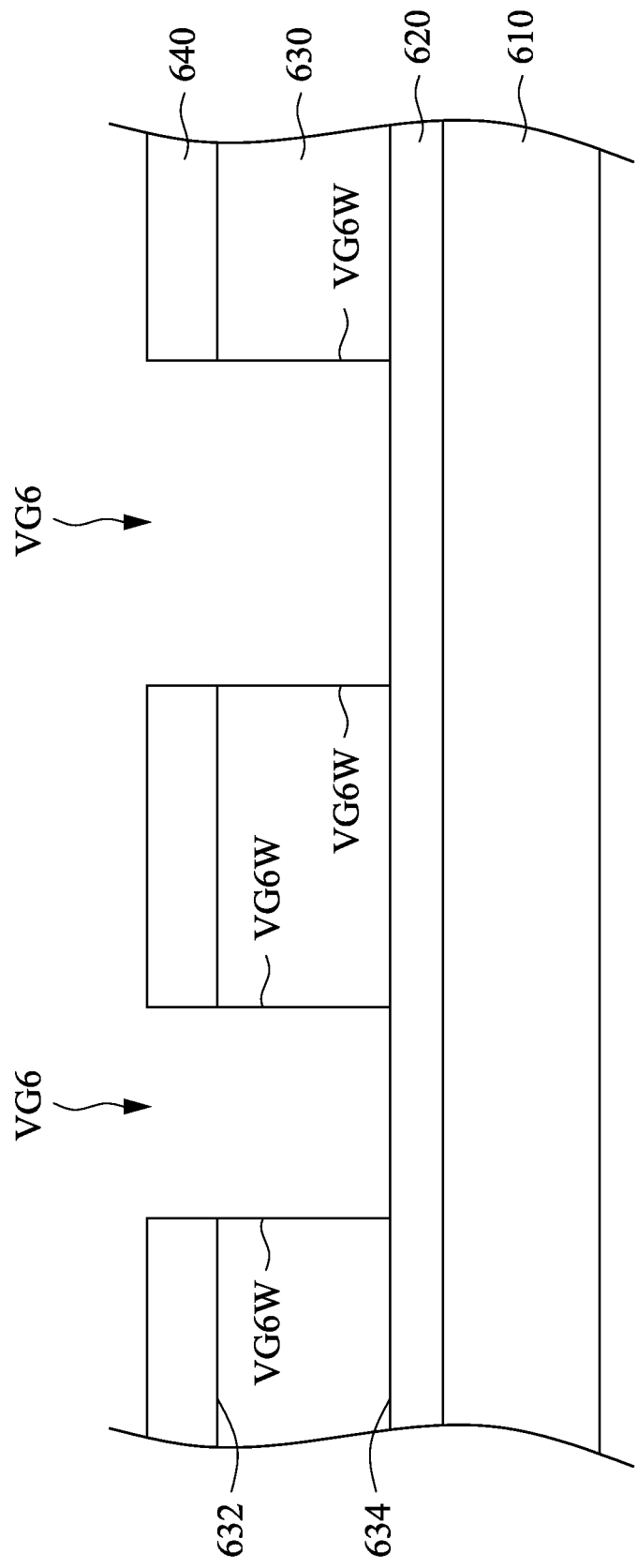

As shown in FIG. 6B, the material layer 630 is etched to form plural vertical gaps VG6 in the material layer 630. Because the exposed portions 636 of the material layer 530 are not covered by the mask layer 640, the exposed portions 636 of the material layer 630 are removed, thereby forming the vertical gaps VG6. Each of the vertical gaps VG6 has a vertical sidewall VG6W orthogonal to the top surface 632 and the bottom surface 634 of the material layer 630, and the vertical sidewalls VG6W extend from the bottom surface 634 of the material layer 630 to the top surface 632 of the material layer 630. In some embodiments, the material layer 630 is etched by using a wet etching process to form the vertical gaps VG6, but embodiments of the present invention are not limited thereto.

Figure 6C:
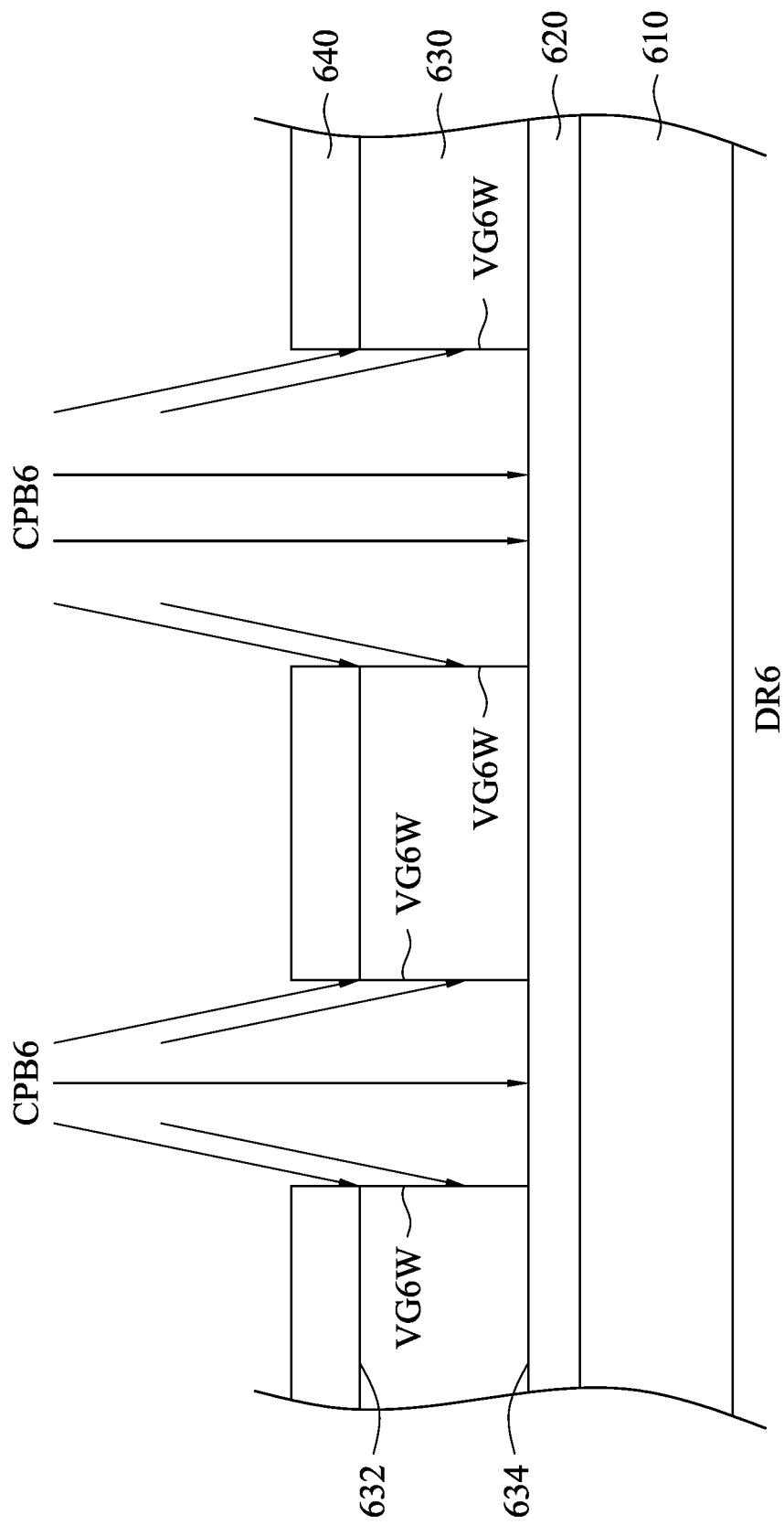

As shown in FIG. 6C, the vertical sidewalls VG6W of the vertical gaps VG6 are etched by using directional charged particle beams CPB6. In some embodiments, equipment used to etch the vertical sidewalls VG6W is similar to the equipment shown in FIG. 1. The directional charged particle beams CPB6 are similar to the directional charged particle beams CPB1, in which each of the directional charged particle beams CPB6 is provided to have a single peak as shown in FIG. 3C. In some embodiments, the single peak corresponds to a predetermined angle substantially 0 degree.

Figure 6D:
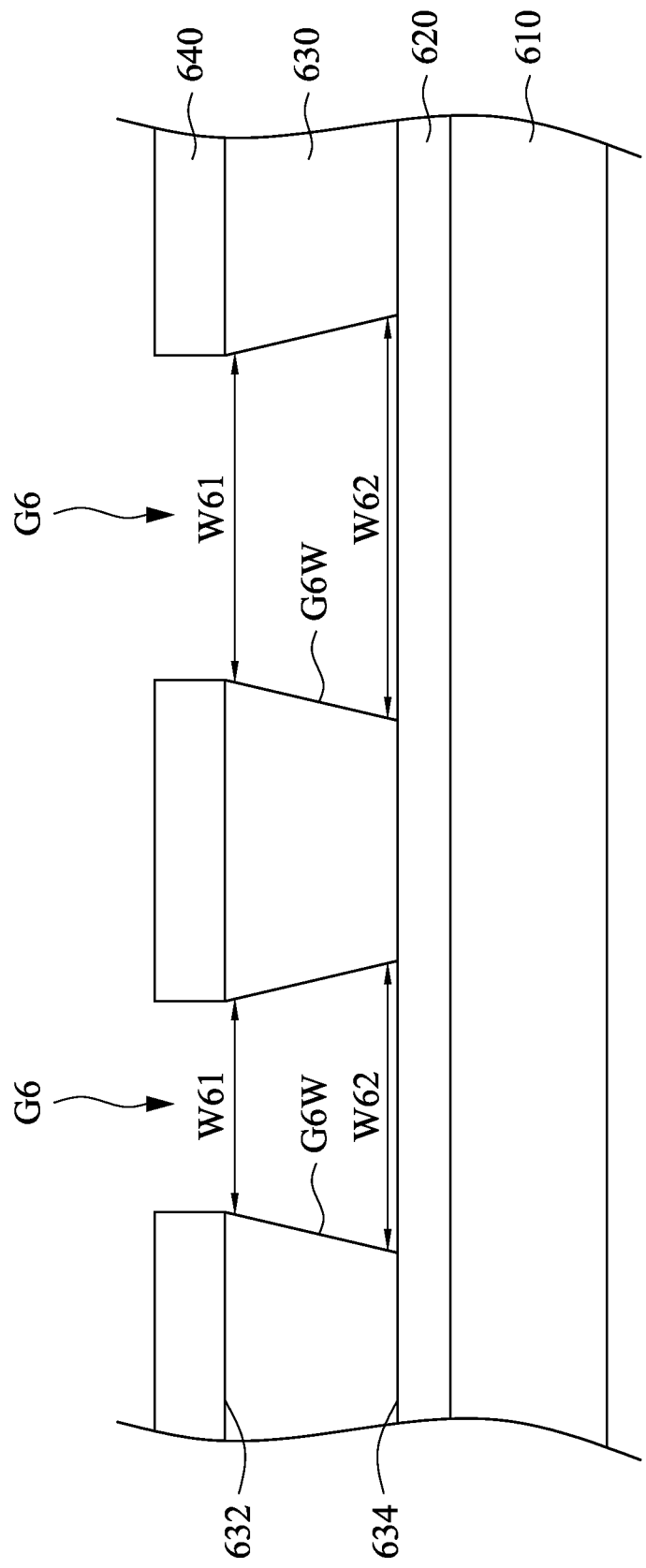

Then, after the sidewalls VG6W of the vertical gaps VG6 are etched, gaps G6 each having a re-entrance profile are formed as shown in FIG. 6D. The gap G6 having the re-entrance profile has a top portion adjacent to the top surface 632 and a bottom portion adjacent to the bottom surface 634, and the top portion of the gap G6 has a width W61 smaller than a width W62 of the bottom portion of the gap G6, because the gap G6 have inclined sidewalls G6W.

Similar to the gaps G2, the gaps G6 having the re-entrance profile also benefit formation of interconnections.

Figure 7A:
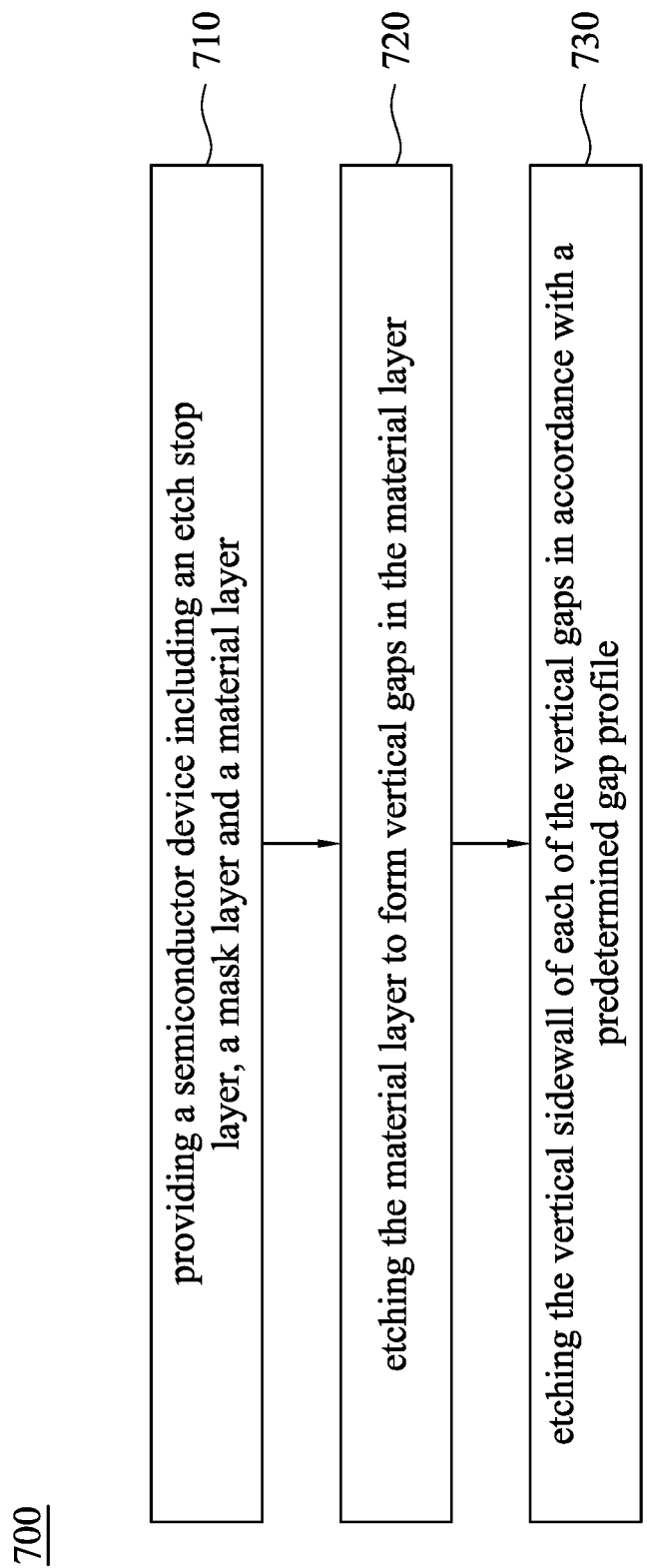
FIG. 7A is a flow chart of a method for forming gaps in a material layer in accordance with an embodiment of the present disclosure.

Referring to FIG. 7A, FIG. 7A is a flow chart of a method 700 for forming gaps in a material layer in accordance with an embodiment of the present disclosure. The method 700 begins at operation 710. In operation 710, the semiconductor device including an etch stop layer, a material layer and a mask layer is provided. For example, the semiconductor device 500 including the etch stop layer 520, the material layer 530 and the mask layer 540 is provided as shown in FIG. 5A. For another example, the semiconductor device 600 including the etch stop layer 620, the material layer 630 and the mask layer 640 is provided as shown in FIG. 6A.

Thereafter, in operation 720, a material layer is etched to remove exposed portions of the material layer to form the vertical gaps. For example, the material layer 530 is etched to remove the exposed portions 536 of the material layer 530 to form the vertical gaps VG5 as shown in FIG. 5B. For another example, the material layer 630 is etched to remove the exposed portions 636 of the material layer 630 to form the vertical gaps VG6 as shown in FIG. 6B.

Then, in operation 730, a vertical sidewall of each of the vertical gaps is etched in accordance with a predetermined gap profile to form gaps each having the re-entrance profile. For example, the vertical sidewall VG5W of each of the vertical gaps VG5 is etched in accordance with a predetermined gap profile to form the gaps G5. For another example, the vertical sidewall VG6W of each of the vertical gaps VG6 is etched in accordance with a predetermined gap profile to form the gaps G6.

Figure 7B:
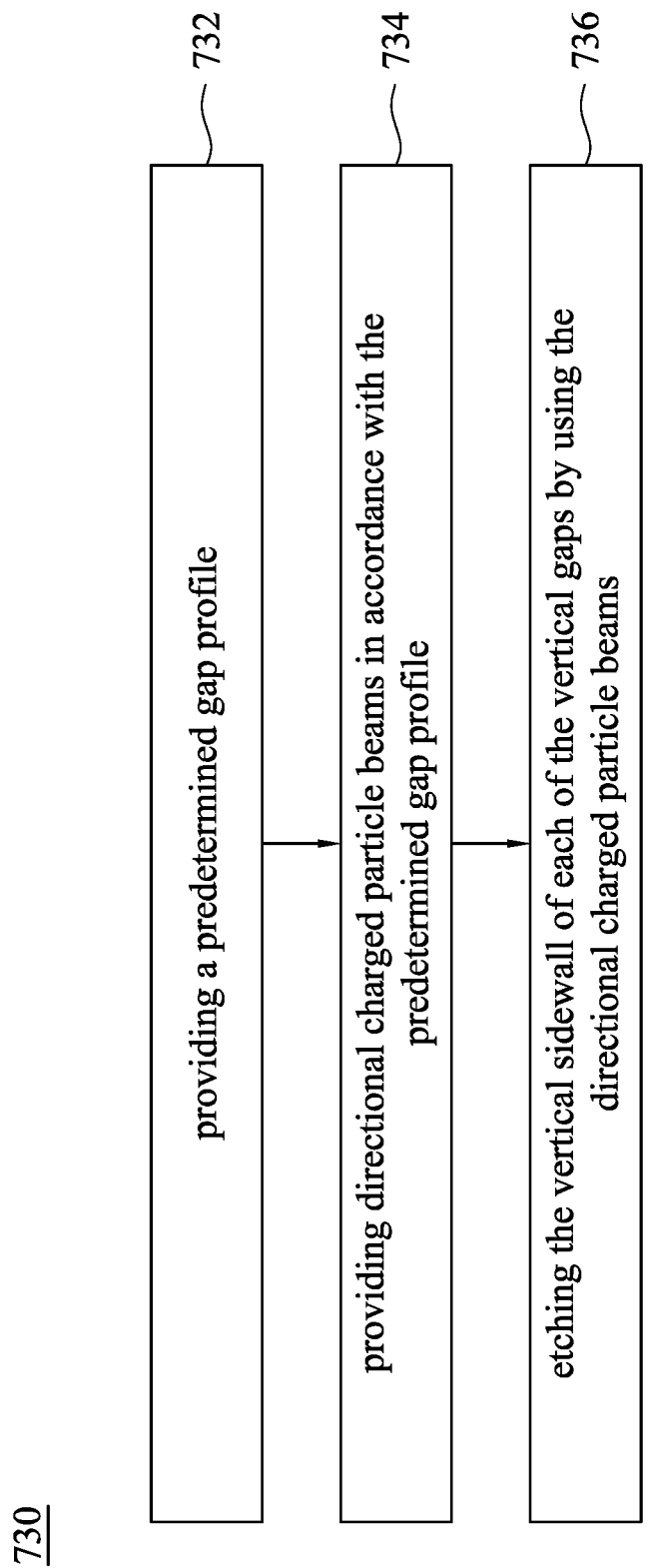
FIG. 7B is a flow chart of the operation for etching the material layer in accordance with an embodiment of the present disclosure.

Referring to FIG. 7B, FIG. 7B is a flow chart of operation 730 for etching the material layer. Operation 730 begins at operation 732. In operation 732, a predetermined gap profile is provided. In some embodiments, the predetermined gap profile is the re-entrance profile, but embodiments of the present disclosure are not limited thereto. Then, in operation 734, directional charged particle beams are provided in accordance with the predetermined gap profile. For example, the directional charged particle beams CPB5 having two peaks are provided. For another example, the directional charged particle beams CPB6 having a single peak are provided.

Further, in some embodiments, the vertical distance Z (shown in FIG. 1) between the semiconductor device and the aperture is determined in accordance with the predetermined gap profile, and the directional charged particle beams CPB5 are provided in accordance with the vertical distance Z and the predetermined gap profile. In some embodiments, the directional charged particle beams CPB5 having two peaks corresponding to two angles substantially 30 degrees and −30 degrees are provided when the vertical distance Z is substantially 15 mm. In some embodiments, the directional charged particle beams CPB5 having two peaks corresponding to two angles substantially 8 degrees and −8 degrees are provided when the vertical distance Z is substantially 8.5 mm. In some embodiments, the directional charged particle beams CPB5 having two peaks corresponding to two angles substantially 1.3 degrees and −1.3 degrees are provided when the vertical distance Z is substantially 7 mm.

Thereafter, in operation 736, the vertical sidewall of each of the vertical gaps is etched in accordance with a predetermined gap profile by using the directional charged particle beams. For example, the vertical sidewalls VG5W of the vertical gaps VG5 are etched by using the directional charged particle beams CPB5, as shown in FIG. 5C and FIG. 5D. For another example, the vertical sidewalls VG6W of the vertical gaps VG6 are etched by using the directional charged particle beams CPB6, as shown in FIG. 6C and FIG. 6D.

Figure 8A:
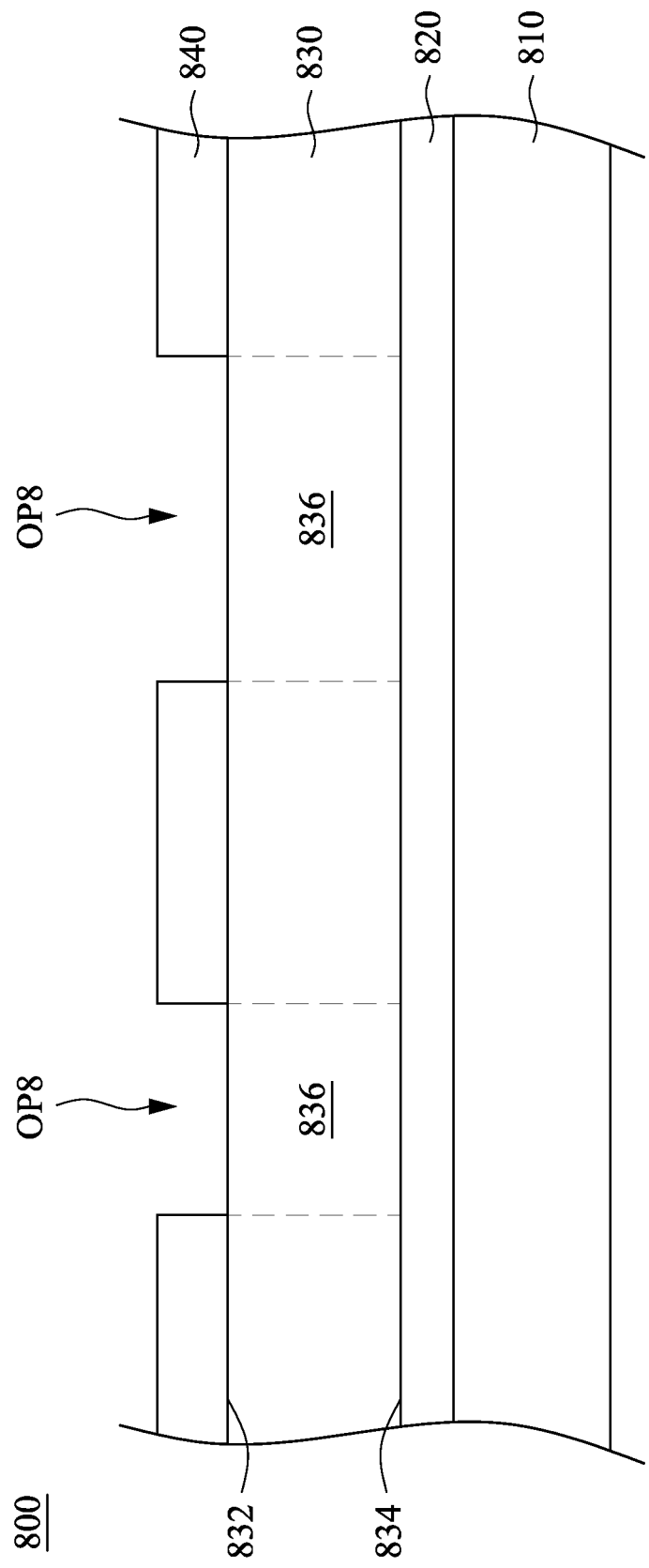

Referring to FIG. 8A to FIG. 8D, FIG. 8A to FIG. 8D are cross-sectional views of intermediate stages showing a method for forming gaps in accordance with some embodiments of the present disclosure. As shown in FIG. 8A, a semiconductor device 800 to be etched is provided. The semiconductor device 800 includes a circuit layer 810, an etch stop layer 820, a material layer 830 and a mask layer 840. The circuit layer 810 may include active circuits or passive circuits. In some embodiments, the circuit layer 810 includes transistor circuits formed on a semiconductor substrate.

The etch stop layer 820 is disposed on the circuit layer 810. The etch stop layer 820 is used to protect the circuit layer 810 from being damaged by subsequent etching processes. In some embodiments, the etch stop layer 820 is formed by titanium nitride, silicon, silicon nitride, or oxide, but embodiments of the present disclosure are not limited thereto.

The material layer 830 is disposed on the etch stop layer 820. The material layer 830 is etched in the subsequent etching processes to form plural gaps for interconnection. The material layer 830 has a top surface 832 and a bottom surface 834. The top surface 832 is adjacent to the mask layer 840, and the bottom surface 834 is adjacent to the etch stop layer 820. In some embodiments, the material layer 830 is formed by silicon nitride, spin-on-carbon, or silicon oxide, but embodiments of the present disclosure are not limited thereto.

The mask layer 840 is disposed on the material layer 830. The mask layer 840 is formed to have openings OP81, thereby exposing portions 836 of the material layer 830. In some embodiments, the mask layer 840 is formed by a photoresist bottom layer, silicon oxide, or silicon nitride, but embodiments of the present disclosure are not limited thereto.

Figure 8B:
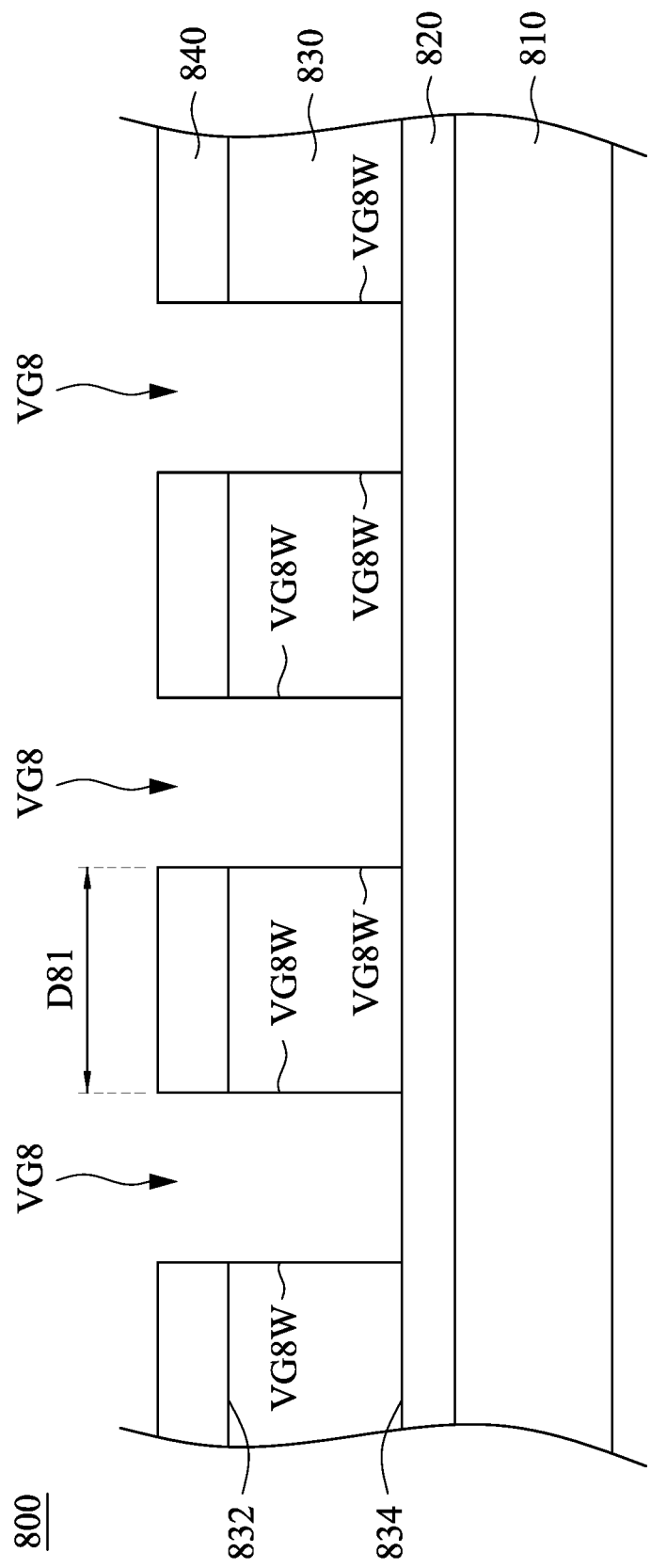
Figure 8D:
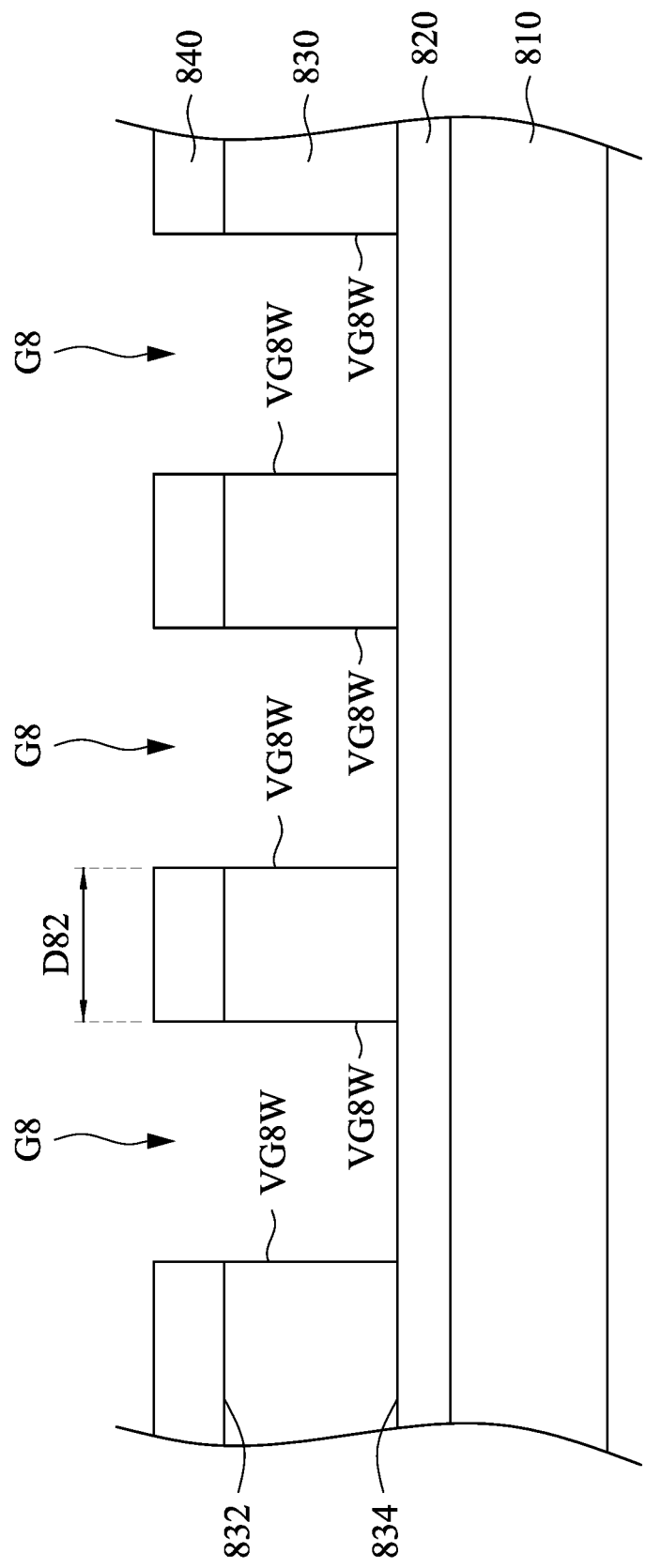

As shown in FIG. 8B, the material layer 830 is etched to form plural vertical gaps VG8 in the material layer 830. Because the exposed portions 836 of the material layer 830 are not covered by the mask layer 840, the exposed portions 836 of the material layer 830 are removed, thereby forming the vertical gaps VG8, in which there is a gap distance D81 between adjacent two of the vertical gaps VG8.

Each of the vertical gaps VG8 has a vertical sidewall VG8W orthogonal to the top surface 832 and the bottom surface 834 of the material layer 830, and the vertical sidewalls VG8W extend from the bottom surface 834 of the material layer 830 to the top surface 832 of the material layer 830. In some embodiments, the material layer 830 is etched by using a wet etching process to form the vertical gaps VG8, but embodiments of the present invention are not limited thereto.

As shown in FIG. 8C(1) and FIG. 8C(2), the vertical sidewalls VG5W of the vertical gaps VG5 are etched by using directional charged particle beams CPB81 or CPB82. In some embodiments, equipment used to etch the vertical sidewalls VG8W is similar to the equipment shown in FIG. 1. The directional charged particle beams CPB81 and CPB82 are similar to the directional charged particle beams CPB1, in which each of the directional charged particle beams CPB81 can be provided to have two peaks as shown in FIG. 8C(1), and each of the charged particle beams CPB82 can be provided to have a single peak as shown in FIG. 8C(2).

Further, the mask layer 840 is also etched by the directional charged particle beams CPB81 or CPB82 when the vertical sidewalls VG5W of the vertical gaps VG5 are etched, thereby uniformly decreasing the distance between adjacent two of the vertical gaps VG8 (maybe referred to as "end to end push").

After the etching of the directional charged particle beams CPB8, gaps G8 are formed, and there is a gap distance D82 between adjacent two of the gaps G8, in which the gap distance D82 is smaller than the gap distance D81.

Figure 9A:
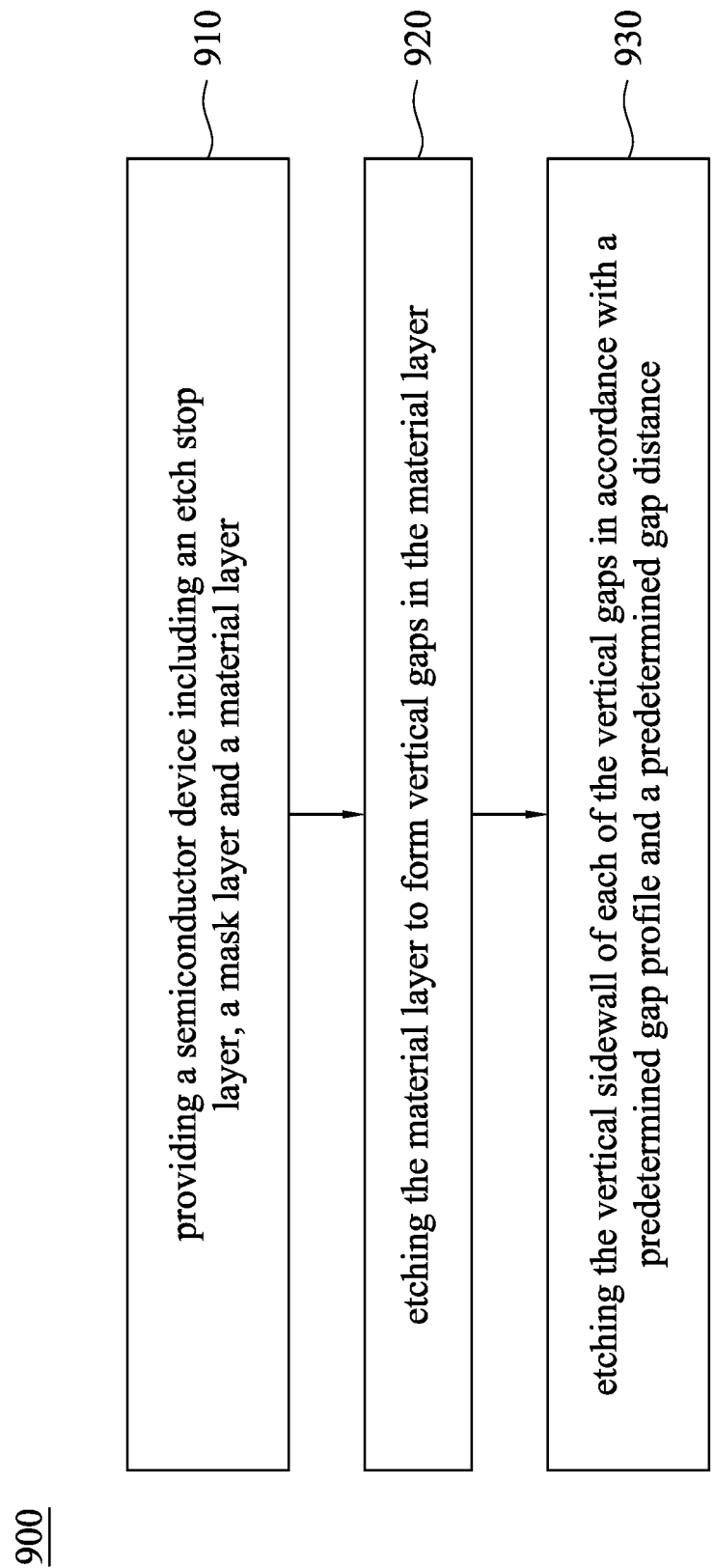
FIG. 9A is a flow chart of a method for forming gaps in a material layer in accordance with an embodiment of the present disclosure.

Referring to FIG. 9A, FIG. 9A is a flow chart of a method 900 for forming gaps in a material layer in accordance with an embodiment of the present disclosure. The method 900 begins at operation 910. In operation 910, the semiconductor device 800 including the etch stop layer 820, the material layer 830 and the mask layer 840 is provided, as shown in FIG. 8A.

Thereafter, in operation 920, the material layer 830 is etched to form the vertical gaps VG8 in the material layer 830 as shown in FIG. 8B.

Then, in operation 930, the vertical sidewall VG8W of each of the vertical gaps VG8 is etched in accordance with a predetermined gap profile and a predetermined gap distance to form the wider gaps G8.

Figure 9B:
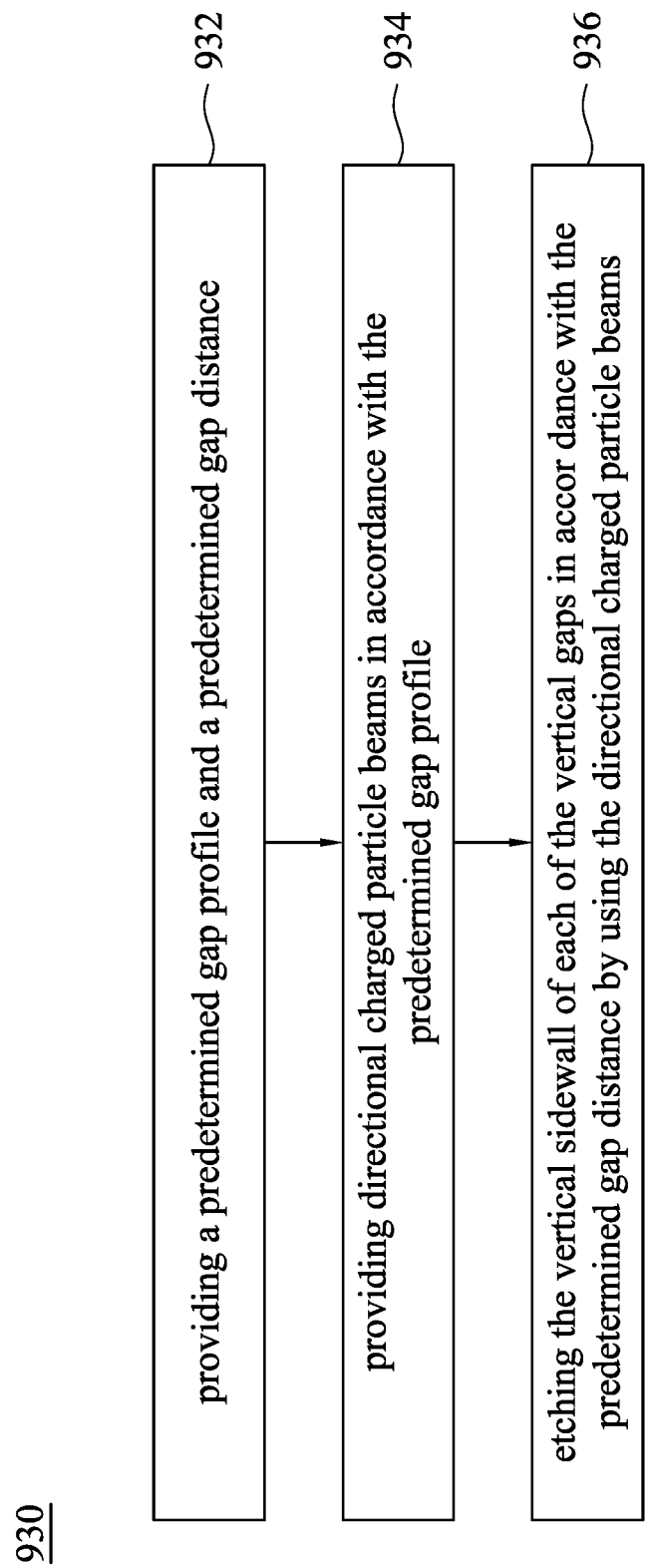
FIG. 9B is a flow chart of the operation for etching the material layer in accordance with an embodiment of the present disclosure.

Referring to FIG. 9B, FIG. 9B is a flow chart of operation 930 for etching the material layer. Operation 930 begins at operation 932. In operation 932, a predetermined gap profile and a predetermined gap distance, such as the distance D82, are provided. In some embodiments, the predetermined gap profile is a vertical gap profile, but embodiments of the present disclosure are not limited thereto. Then, in operation 934, the directional charged particle beams CPB81 or CPB82 are provided in accordance with the predetermined gap profile. For example, the directional charged particle beams CPB81 having two peaks are provided. For another example, the directional charged particle beams CPB82 having a single peak are provided.

Further, in some embodiments, the vertical distance Z (shown in FIG. 1) between the semiconductor device and the aperture is determined in accordance with the predetermined gap profile, and the directional charged particle beams CPB81 or CPB82 are provided in accordance with the vertical distance Z and the predetermined gap profile. In some embodiments, the directional charged particle beams CPB81 having two peaks corresponding to two angles substantially 30 degrees and −30 degrees are provided when the vertical distance Z is substantially 15 mm. In some embodiments, the directional charged particle beams CPB81 having two peaks corresponding to two angles substantially 8 degrees and −8 degrees are provided when the vertical distance Z is substantially 8.5 mm. In some embodiments, the directional charged particle beams CPB81 having two peaks corresponding to two angles substantially 1.3 degrees and −1.3 degrees are provided when the vertical distance Z is substantially 7 mm.

Thereafter, in operation 936, the vertical sidewall VG8W of each of the vertical gaps VG8 is etched in accordance with the distance D82 by using the directional charged particle beams CPB8.

Because, the method 900 utilizes the directional charged particle beams CPB81 or CPB82 to etch the vertical sidewall VG8W of each of the vertical gaps VG8, the distance between adjacent two of the gaps G8 can be precisely controlled.

In accordance with another embodiment of the present disclosure, the present disclosure provides equipment for forming gaps in a material layer. The equipment includes a supporter and an etching device. The supporter is configured to support a semiconductor device. The semiconductor device includes an etch stop layer, a material layer located on the etch stop layer, and a mask layer located on etch stop layer. The mask layer has plural openings to expose portions of the material layer. The etching device is configured to emit a plurality of directional charged particle beams to etch the exposed portions of the material layer for forming a plurality of gaps in the material layer, in which the etching device has plural ion extraction apertures to emit the directional charged particle beams. A vertical distance between the semiconductor device and the ion extraction apertures is determined in accordance with a profile of each of the gap, each of the directional charged particle beams has two energy peaks at two angles, and the angles are determined in accordance with a profile of each of the gaps and the vertical distance.

In some embodiments of the present disclosure, a method includes forming a dielectric layer over a circuit layer including a transistor; forming first openings in the dielectric layer, wherein each of the first openings has a trapezoid cross-section; forming isolation materials in the first openings, respectively; removing the dielectric layer to form a second opening between the isolation materials; and forming a metal in the second opening, wherein the metal has an inverted-trapezoid cross-section.

In some embodiments of the present disclosure, a method includes forming an etch stop layer over a circuit layer; forming a dielectric layer over the etch stop layer; etching the dielectric layer using directional charged particle beams to form first openings in the dielectric layer, wherein etching the dielectric layer stops until a top surface of the etch stop layer is exposed; forming isolation materials in the first openings; etching the dielectric layer and the etch stop layer to form a second opening between the isolation materials and extending through the etch stop layer; and filling the second opening with a metal layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
forming an etch stop layer over a top surface of a circuit layer including a transistor;
forming a dielectric layer over the circuit layer;
forming first openings in the dielectric layer, wherein each of the first openings has a trapezoid cross-section;
forming isolation materials in the first openings, respectively;
removing the dielectric layer to form a second opening between the isolation materials, wherein the second opening extends through the etch stop layer; and
forming a metal in the second opening, wherein the metal has an inverted-trapezoid cross-section, wherein the metal is in contact with a sidewall of the etch stop layer.

2. The method of claim 1, further comprising:
forming a mask layer in direct contact with a top surface of the dielectric layer, wherein the mask layer comprises third openings, and wherein forming the first openings in the dielectric layer is performed by etching the dielectric layer through the third openings of the mask layer.

3. The method of claim 1, wherein forming the first openings in the dielectric layer is performed by etching the dielectric layer using directional charged particle beams.

4. The method of claim 3, wherein etching the dielectric layer using directional charged particle beams comprises moving the circuit layer along a direction perpendicular to a top surface of the circuit layer.

5. The method of claim 3, wherein each of the directional charged particle beams is provided to have two energy peaks.

6. The method of claim 1, wherein forming the first openings in the dielectric layer comprises:
   performing a first etching process to the dielectric layer to form the first openings in the dielectric layer, wherein each of the first openings has a vertical sidewall orthogonal to a bottom surface of the dielectric layer; and
   performing a second etching process to the dielectric layer, such that the vertical sidewall of each of the first openings becomes an inclined sidewall.

7. A method, comprising:
   forming an etch stop layer over a circuit layer;
   forming a dielectric layer over the etch stop layer;
   etching the dielectric layer using directional charged particle beams to form first openings in the dielectric layer, wherein etching the dielectric layer stops until a top surface of the etch stop layer is exposed;
   forming isolation materials in the first openings;
   etching the dielectric layer and the etch stop layer to form a second opening between the isolation materials and extending through the etch stop layer; and
   filling the second opening with a metal layer.

8. The method of claim 7, wherein a width of each of the first openings increases as a distance from the etch stop layer decreases, and a width of the second opening increases as a distance from the etch stop layer increases.

9. The method of claim 7, wherein each of the directional charged particle beams is provided to have two energy peaks.

10. The method of claim 7, wherein the isolation materials fill an entirety of the first openings.

11. The method of claim 7, wherein etching the dielectric layer using directional charged particle beams to form the first openings in the dielectric layer comprises:
   performing a first etching process to the dielectric layer to form the first openings in the dielectric layer, wherein each of the first openings has a vertical sidewall orthogonal to a bottom surface of the dielectric layer; and
   performing a second etching process to the dielectric layer, such that the vertical sidewall of each of the first openings becomes an inclined sidewall.

12. The method of claim 7, further comprising forming a mask layer in direct contact with a top surface of the dielectric layer, wherein the mask layer comprises third openings, wherein etching the dielectric layer is performed through the third openings of the mask layer, and wherein portions of the first openings are vertically below the mask layer.

13. A method, comprising:
   fixing a semiconductor device on a supporter disposed in a chamber, wherein the semiconductor device comprises an etch stop layer and a dielectric layer over the etch stop layer; and
   forming first openings in the dielectric layer of the semiconductor device and exposing the etch stop layer, wherein each of the first openings is formed by emitting, through an etching device, a plurality of directional charged particle beams toward the semiconductor device, wherein the etching device has a plurality of ion extraction apertures configured to emit the directional charged particle beams, and the ion extraction apertures are configured such that each of the directional charged particle beams has two energy peaks at two angles;
   forming isolation materials in the first openings;
   etching the dielectric layer and the etch stop layer to form a second opening between the isolation materials and extending through the etch stop layer; and
   filling the second opening with a metal layer, such that the metal layer is in contact with a sidewall of the etch stop layer.

14. The method of claim 13, wherein the ion extraction apertures are configured such that the two angles are symmetrical with respect to 0 degree.

15. The method of claim 13, wherein the etching device is configured to emit the directional charged particle beams toward the semiconductor device along a first direction, and the supporter is movable along a second direction different from the first direction.

16. The method of claim 13, wherein the ion extraction apertures are configured such that the two angles are substantially 30 degrees and −30 degrees, respectively.

17. The method of claim 13, wherein a vertical distance between the semiconductor device and the ion extraction apertures is substantially 7 nm.

18. The method of claim 13, wherein each of the first openings has a trapezoid cross-sectional profile, and the second opening has an inverted-trapezoid cross-sectional profile.

19. The method of claim 13, further comprising forming a mask layer in direct contact with a top surface of the dielectric layer, wherein the mask layer comprises third openings, the first openings are formed in the first openings in the dielectric layer through the third openings of the mask layer.

20. The method of claim 19, wherein portions of the first openings are vertically below the mask layer.

* * * * *